United States Patent [19]

Legrady

[11] Patent Number: 5,605,430
[45] Date of Patent: *Feb. 25, 1997

[54] FEEDER AND METHOD OF SUPPLYING A CONTINUOUS STRIP OF SURFACE MOUNT CONTACTS TO SURFACE MOUNTING EQUIPMENT

[75] Inventor: Janos Legrady, Putnam Valley, N.Y.

[73] Assignee: Zierick Manufacturing Corporation, Mount Kisco, N.Y.

[ * ] Notice: The term of this patent shall not extend beyond the expiration date of Pat. No. 5,449,265.

[21] Appl. No.: 395,822

[22] Filed: Feb. 28, 1995

Related U.S. Application Data

[63] Continuation-in-part of Ser. No. 196,864, Feb. 15, 1994, Pat. No. 5,449,265.

[51] Int. Cl.$^6$ .................................................. B65B 69/00
[52] U.S. Cl. .............................................. 414/412; 221/74
[58] Field of Search ..................................... 414/412, 222, 414/786; 221/25, 70–74; 83/277, 642, 694, 942, 945; 225/103

[56] References Cited

U.S. PATENT DOCUMENTS

| | | | |
|---|---|---|---|
| 4,096,945 | 6/1978 | Meltor, Jr. et al. | 414/412 X |
| 4,428,709 | 1/1984 | Peters | 414/412 |
| 4,473,247 | 9/1984 | Itemadani et al. | 414/752 X |
| 4,494,902 | 1/1985 | Kuppers et al. | 221/74 X |
| 4,740,136 | 4/1988 | Agai et al. | 221/74 X |
| 4,838,452 | 6/1989 | Hamilton et al. | 221/74 X |
| 4,909,414 | 3/1990 | Heath | 414/412 X |
| 4,923,089 | 5/1990 | Hinero et al. | 221/25 X |
| 4,942,798 | 7/1990 | Taub et al. | 83/694 X |
| 4,946,339 | 8/1990 | Berg et al. | 414/412 X |
| 5,017,078 | 5/1991 | Ingwersen et al. | 414/412 X |
| 5,020,959 | 6/1991 | Soth | 221/25 X |
| 5,237,901 | 8/1993 | Warga, III | 83/694 X |
| 5,299,902 | 4/1994 | Fujiwara et al. | 221/25 X |
| 5,339,983 | 8/1994 | Caple | 221/25 |
| 5,449,265 | 9/1995 | Legrady et al. | 414/412 |

FOREIGN PATENT DOCUMENTS 453902   10/1991   European Pat. Off. ............... 221/25

*Primary Examiner*—David A. Bucci
*Attorney, Agent, or Firm*—Lackenbach Siegel Marzullo Aronson & Greenspan, P.C.

[57] ABSTRACT

A feeder and method are disclosed for individually dispensing surface-mount contacts in a strip of tab-connected contacts on a pick-and-place machine having a pick-up member and pick-up station actuator for actuating the feeder when the pick-and-place machine is ready for pick-up surface-mount contact oriented along a predetermined direction at the pick-up station. The strip of contacts are fed from a roll or spool and the end received within a guide, with the strip being advanced to position the end contact or connector to be mounted suspended beyond the guide. When the component is ready to be mounted, it is sheared or severed at a connecting tab from the strip to free it. The component is temporarily held in place while the freed component is moved towards the vacuum pick-up nozzle of the pick-and-place machine, and released at such time that the pick-up member of vacuum nozzle has sufficiently engaged the contact to enable it to pick up the contact and remove it from the pick-up station. A control circuit, using a PLC, obtains signals from a series of sensors to regulate the cycle of advancing and sensing the strip of contacts with a series of actuators in the form of solenoids, which cycle is commenced when a pick-up nozzle of a surface mounting machine is sensed at the pick-up station. The tension of the strip is regulated by the control circuit, and a collection system is provided to remove cut off fragments of connecting tabs or carrier strips from the pick-up station.

10 Claims, 20 Drawing Sheets

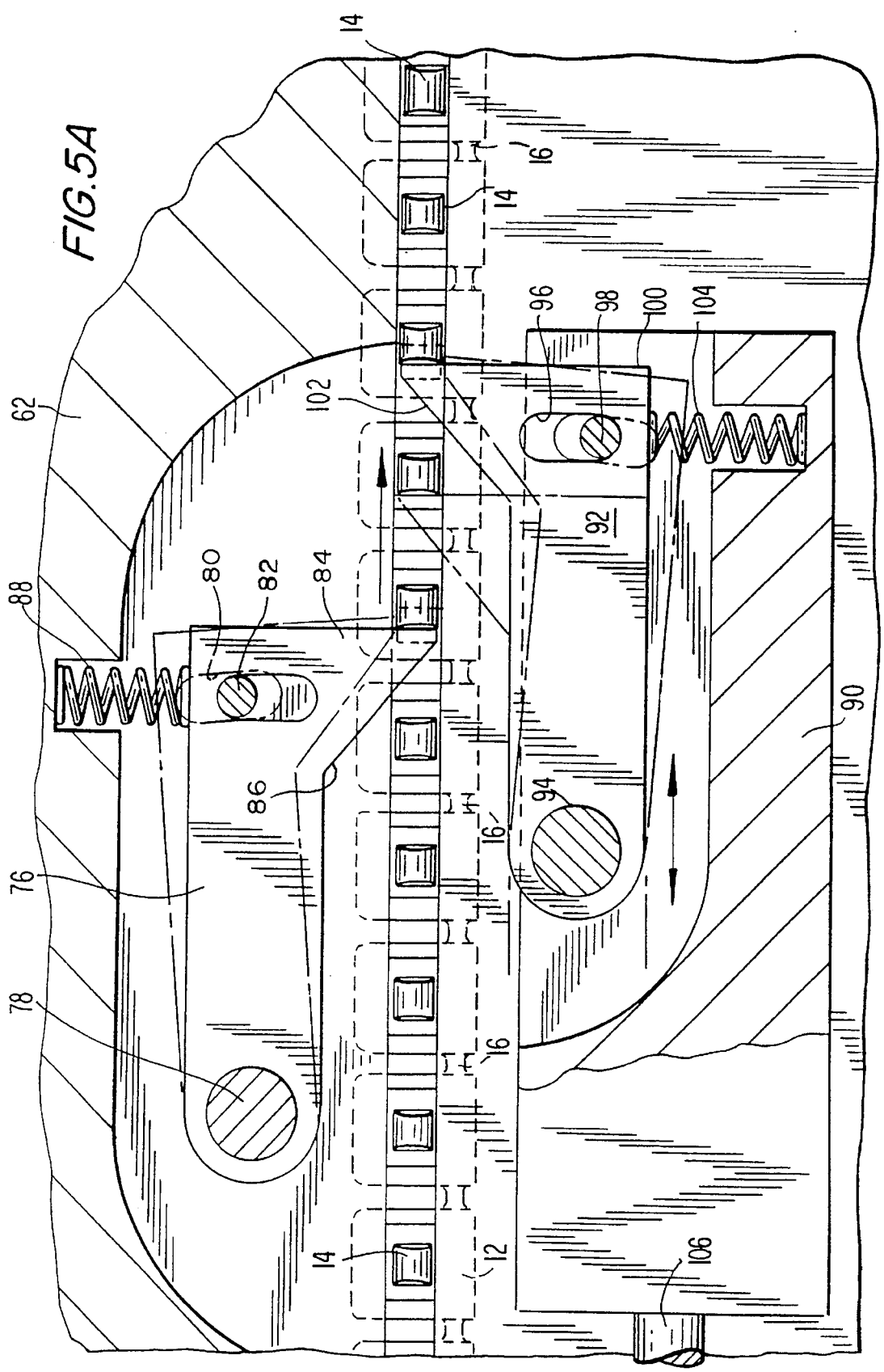

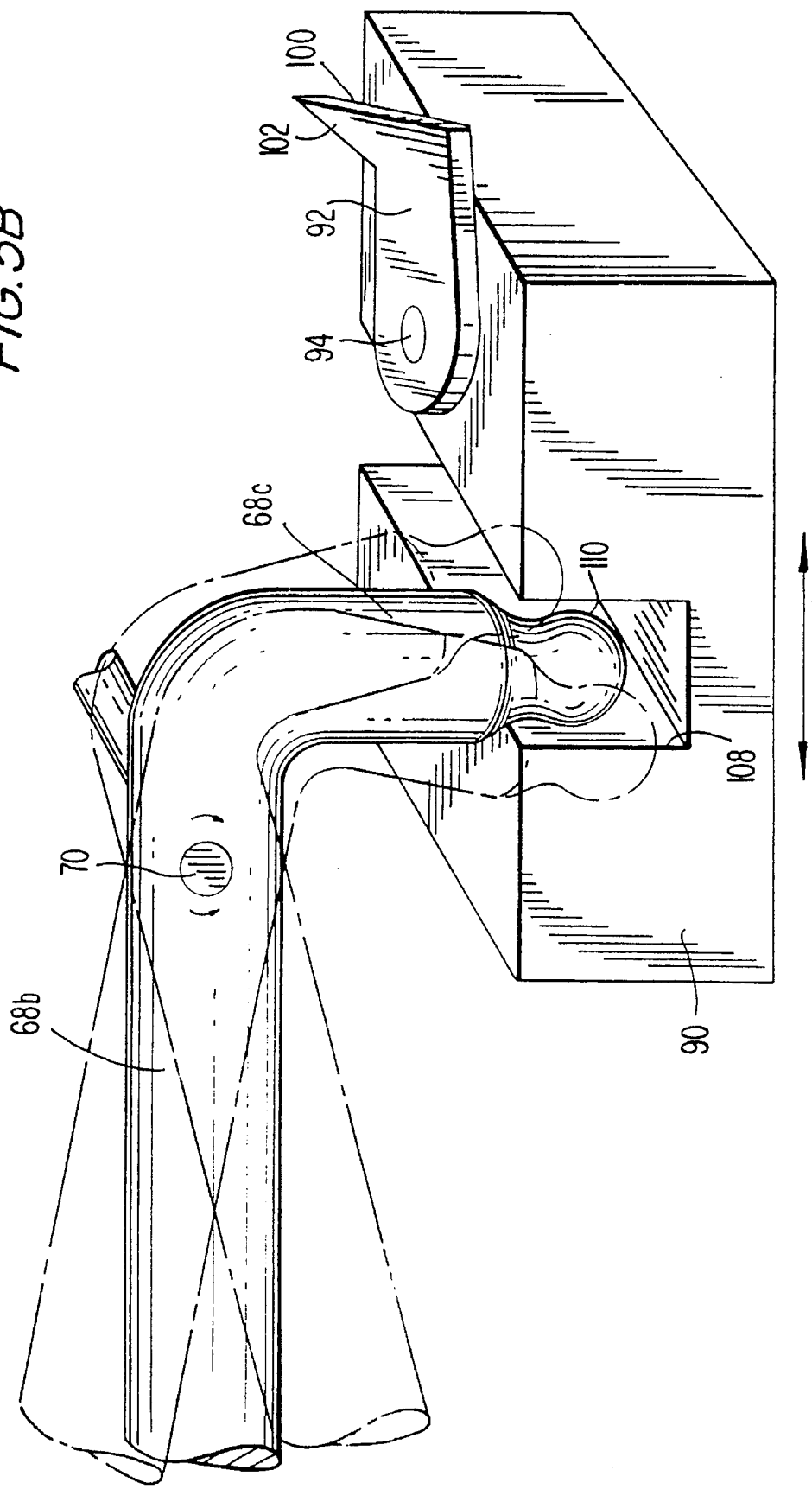

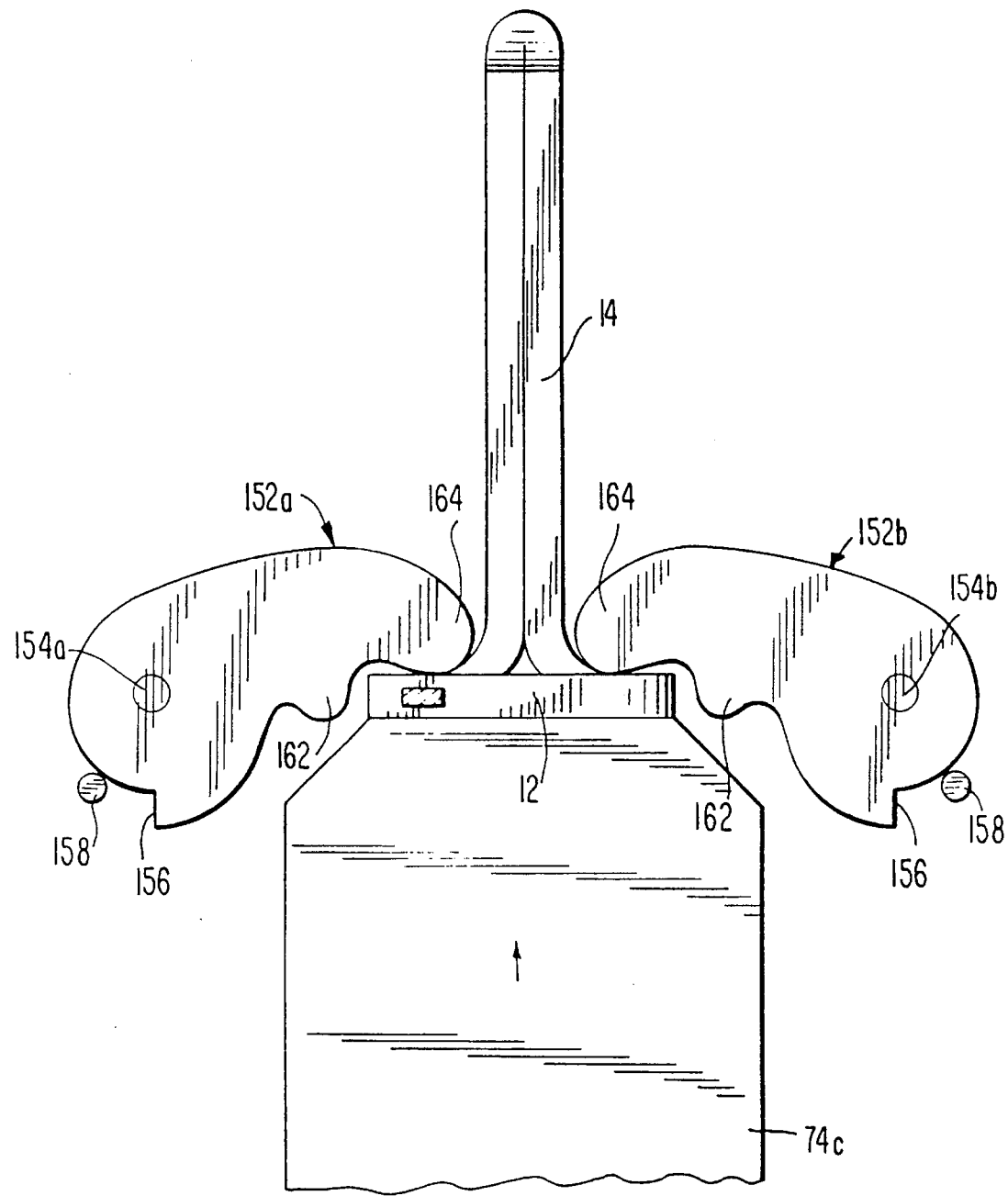

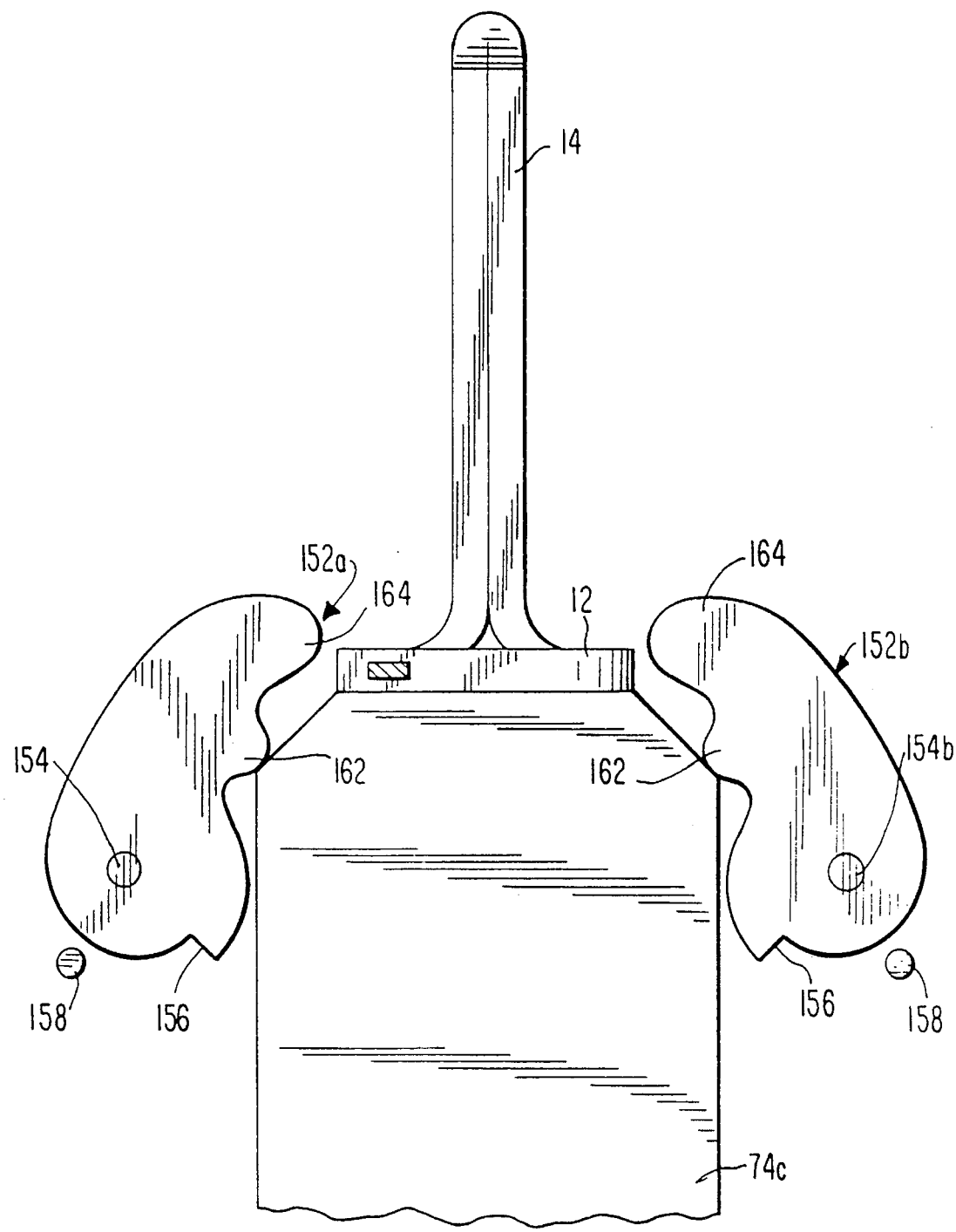

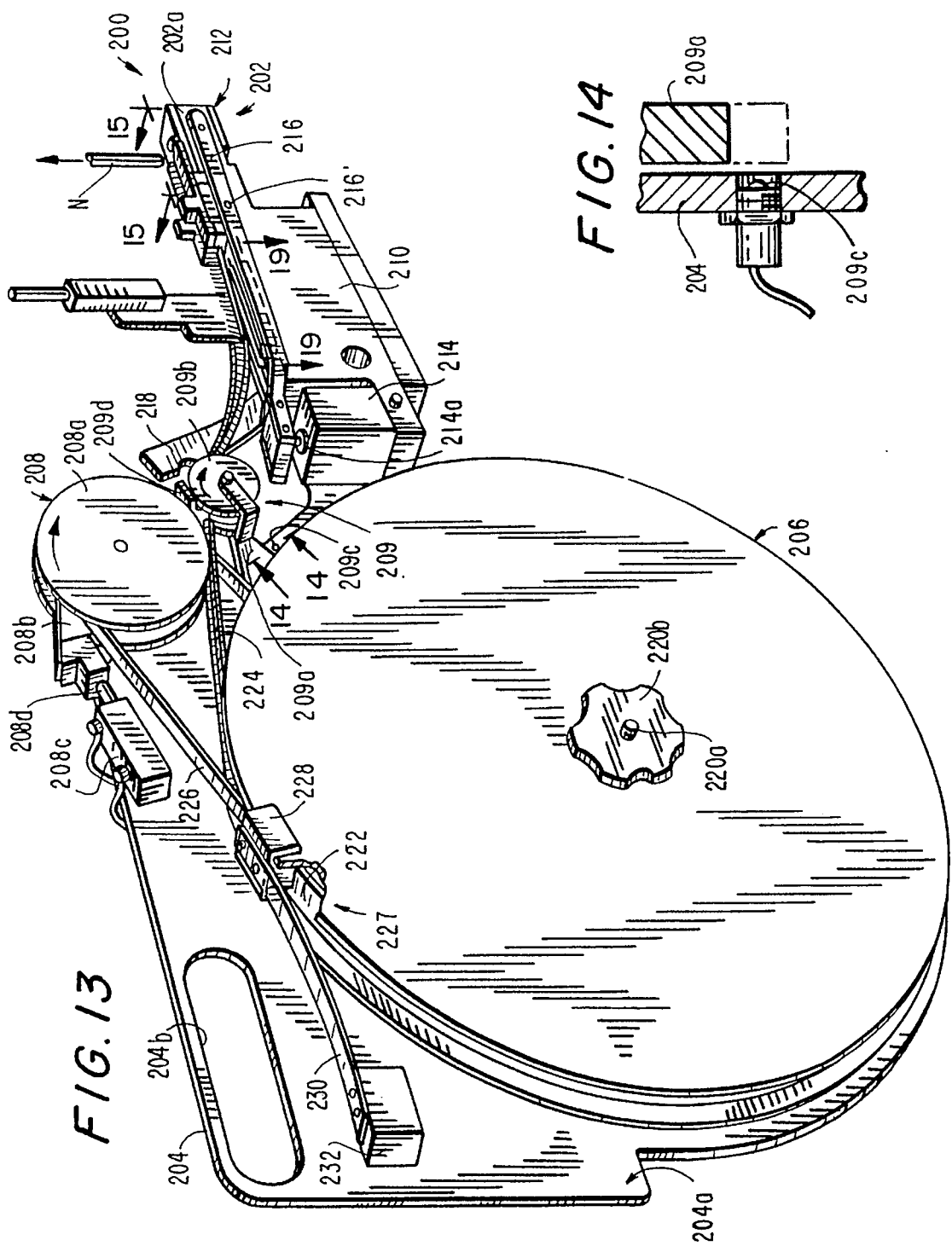

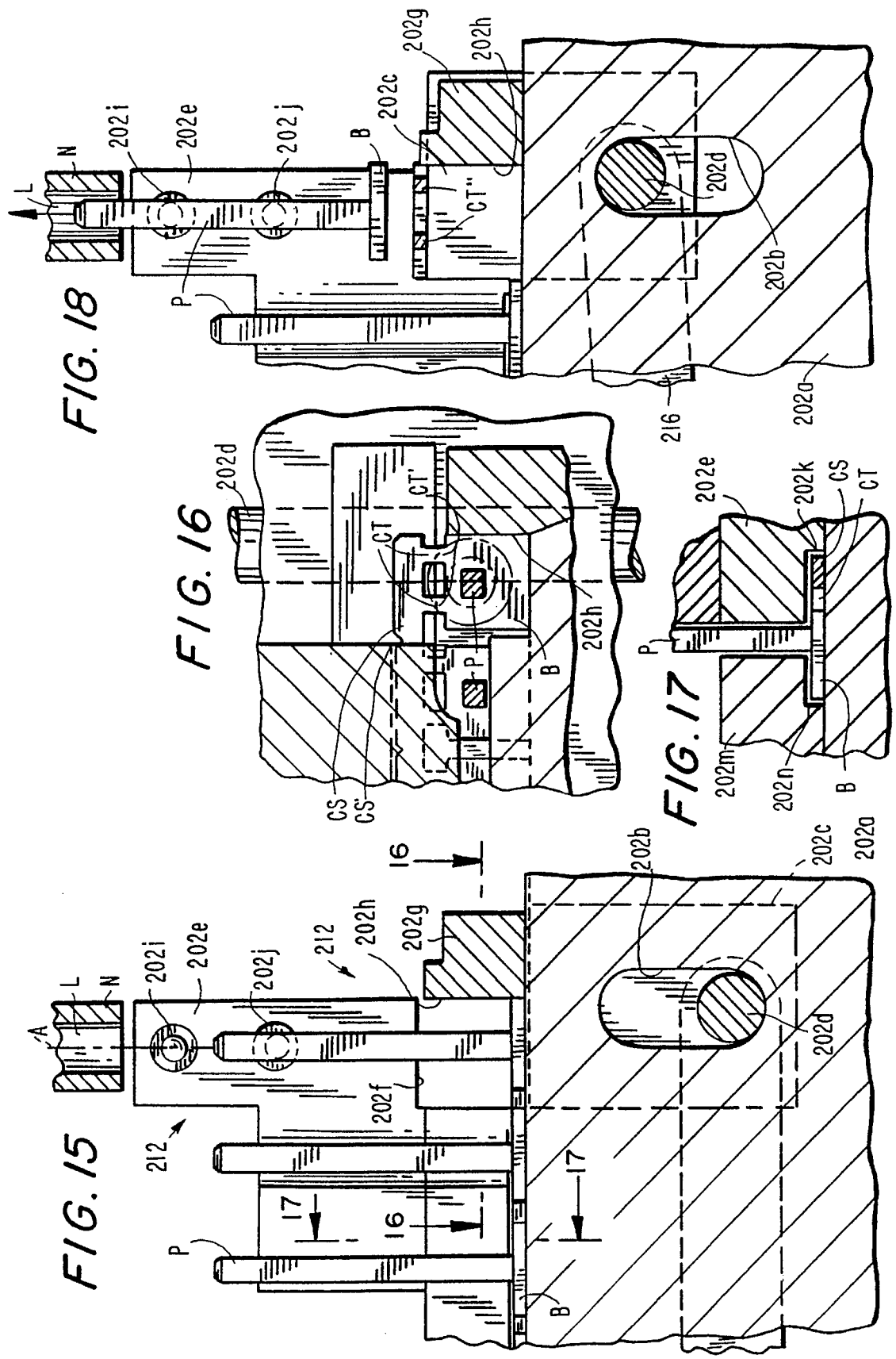

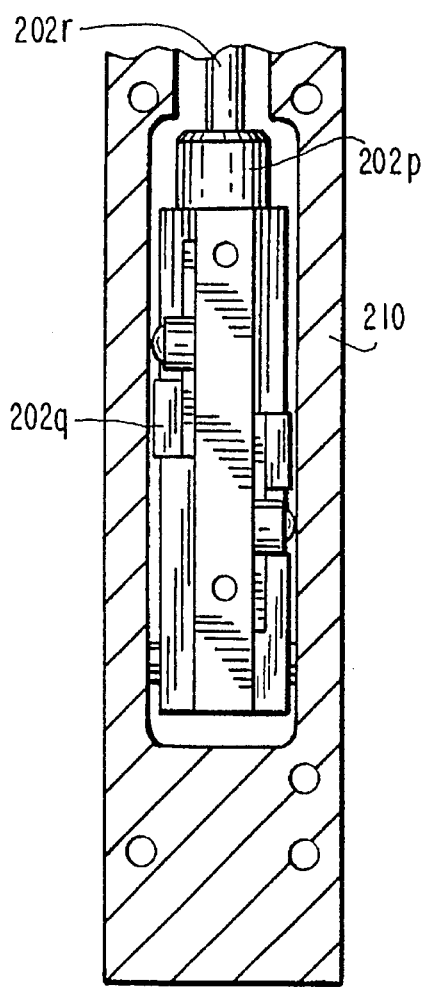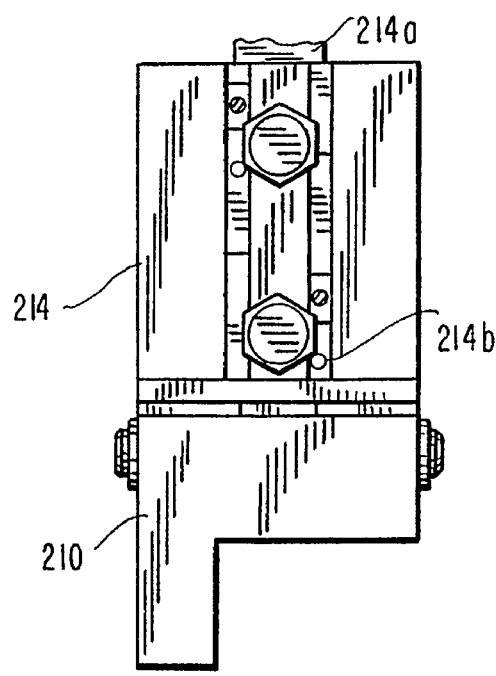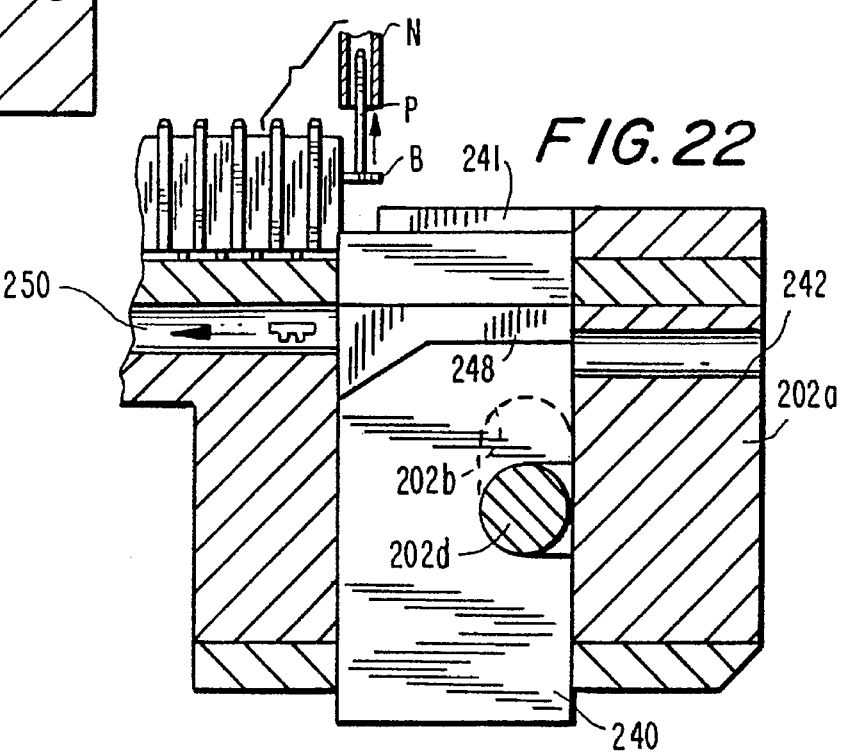

FEEDER AND METHOD OF SUPPLYING A CONTINUOUS STRIP OF SURFACE MOUNT CONTACTS TO SURFACE MOUNTING EQUIPMENT

CROSS REFERENCE TO RELATED APPLICATION

This application is a continuation-in-part of U.S. patent application Ser. No. 08/196,864 filed Feb. 15, 1994, issued as U.S. Pat. No. 5,449,265.

BACKGROUND OF THE INVENTION

The present invention generally relates to automated component mounting apparatus capable of sequentially picking up and placing components on a printed circuit board, and, more particularly, to a feeder for continuously feeding electrical contacts, one at a time, for use by such automated component mounting apparatus.

Pick-and-place machines are well-known and are increasingly used to automate and increase the speed at which electric and/or electronic components are surface mounted on printed circuit boards. Such machinery has also been used for automatically surface mounting miniature electronic component parts, commonly known as integrated circuit (IC) chips. One example of such a component mounting apparatus is disclosed in U.S. Pat. No. 4,473,247 in which the components intended to be mounted are generally flat integrated circuit chips which can be readily engaged by suitably shaped and dimensioned suction nozzles. Other examples of electronic component pick-and-place machines are described in Document No. TI-572-1-0391 published by Matsushita Electric Industrial Co., Ltd. for its "Panasert" series of machines. However, the components which have heretofore been handled by pick-and-place machinery are generally individually packaged on continuous carriers. While this approach has been satisfactory for integrated circuit chips, resistors, capacitors and the like, the approach does not work well for electrical contacts or connectors which tend to have high profiles and come in a wide variety of irregular shapes requiring very accurate placement at a pick up station in order for the suction nozzle to properly engage and be able to pick-up and place the component.

More specifically, the feeder of the present invention is intended to feed electrical contacts or connectors of the type disclosed in U.S. patent application Ser. No. 08/554,342, of which has been assigned to the assignee of the present application. In the aforementioned application, a prior art effort to feed electrical contact pins to a pick-and-place machine is discussed. However, because such pins are carried in individual pockets or compartments of a continuous tape this increases the cost of such pins. Additionally, and more importantly, because the pins are free to move in such pockets or compartments, the individual contacts are difficult to precisely align at the pick-up station. Unless the contact pins are properly aligned in relation to the vacuum nozzle, damage can be done both to the pins as well as to the pick-up nozzle.

Pick-and-place machines are typically provided with a plurality of feeders, each for feeding a different electrical component or part. The feeders for such machines are almost never interchangeable. The different manufacturers of the pick-and-place machines generally design the feeders only for their specific machines. This makes it difficult, if not impossible, to use the feeders from one machine on another machine. To that extent, users of such machinery have frequently been dependent on the feeders supplied by the manufacturer of their specific pick-and-place machine—this decreasing the versatility of such machines. This has, in some instances, limited the range of components that a user can apply to printed circuit boards on particular pick-and-place machine.

SUMMARY OF THE INVENTION

Accordingly, the present invention has been developed with a view to substantially eliminate these disadvantages and inconveniences inherent in the prior art systems and has for its essential object to provide an improved feeder and method of reliably supplying a continuous strip of surface-mounted contacts, such as pins or posts, for pick-and-place machines. In accordance with another aspect of the invention, the feeder is universal and can be adapted for or be actuated by numerous pick-and-place machines made by different manufacturers. According to still another aspect of the present invention, the feeder may be rendered intelligent and can automatically recycle the feeder to always assure that a surface-mounted contact or connector is at the pick-up station to be available whenever the vacuum nozzle of the pick-and-place machine needs to pick up and use a part dispensed by the feeder.

In order to achieve the objectives of the present invention, a feeder is provided for individually dispensing surface-mount contacts in a strip of tab-connected contacts to a pick-and-place machine which has a pick-up member at a pick-up station and an actuator for actuating the feeder when the pick-and-place machine is ready to pick up a surface-mount contact oriented along a predetermined direction. The feeder comprises receiving means for receiving the leading end of the tab-connected strip of surface-mount contacts. Transporting means is provided for transporting at least a leading surface-mount contact with an orientation along said predetermined direction to said pick-up station. Advancing means is provided responsive to the actuator for advancing the strip of contacts one contact at a time along said transporting means. Means, responsive to the actuator, is provided for severing a connecting tab between the leading surface-mount contact and the next following surface-mount contact in the strip to thereby free said leading surface-mount contact. Holding means is provided for temporarily holding said leading surface-mount contact between the time that said leading surface-mount contact is severed from the strip to the time that the pick-up member of the pick-and-place machine has engaged the contact sufficiently to enable it to pick up the contact and remove it from said pick-up station.

In accordance with features of the invention, the cutting means also preferably serves as a holding means for temporarily holding the surface mount contacts until such time that the contacts severed from the strip. Sensing means are provided for at least sensing the presence of the pick-up member or vacuum nozzle at said pick-up station just prior to pick up of the leading surface mount contact. Control means are provided for initiating the operational cycle of the feeder in response to sensing of the pick-up member by the sensing means resulting in the severing of the leading surface mount contact from the strip of contacts and pick up thereof by the pick-up member. Advantageously, tension adjusting means are provided for adjusting the tension of the strip of surface-mount contacts to be substantially uniform at said receiving means substantially independently of the tension of the strip at the source thereof. Also, there is advantageously provided disposing means for removing the severed connecting tabs and/or carrier strip portions from said pick-up station to avoid interference with the continued advancement of the strip of contacts and operation of the feeder.

BRIEF DESCRIPTION OF THE DRAWINGS

Other objects and features of the present invention may become clear from the following description taken in conjunction with the preferred embodiment thereof made reference to the accompanying drawings, in which:

FIG. 5A is a cross-section of a feeder of the type shown in FIG. 4, as visible in plan view, and illustrating spring loaded fingers for intermittently advancing the strip one at a time in a forward direction while preventing reverse movements of the strip in the opposite direction;

FIG. 5B is a schematic view, in perspective, of the movable block shown in FIG. 5 to illustrate how the movable block may be actuated for reciprocal sliding motion in response to vertical reciprocal actuation by a mechanical actuator of the pick-and-place machine;

FIG. 9B is similar to FIG. 9A, but shows the contact in an elevated position and corresponding clamping positions of the holding fingers;

FIG. 9C is similar to FIGS. 9A and 9B, but showing the cutting element and the contact at the upper end of the stroke where the pick-up vacuum nozzle has engaged the pin, showing still further positions of the holding fingers where they disengage from the base of the pin and allow the pin to be freely lifted by the vacuum nozzle;

FIG. 13 is a perspective view similar to FIG. 4, but showing another embodiment of a feeder in accordance with the present invention;

FIG. 14 is an enlarged cross sectional view of the feeder shown in FIG. 13, taken along line 14—14;

FIG. 15 is an enlarged cross sectional view of the feeder shown in FIG. 13 taken along line 15—15;

FIG. 16 is a cross sectional view of the feeder pick-up station in FIG. 15, taken along line 16—16;

FIG. 17 is a cross sectional view of the feeder shown in FIG. 15, taken along line 17—17;

FIG. 18 is similar to FIG. 15, but showing another portion of the operational cycle in which the contact pin has been severed from the continuous strip and is being picked up by a vacuum pick-up nozzle;

FIG. 19 is a cross sectional view of the feeder shown in FIG. 13, taken along line 19—19;

FIG. 20 is an end elevation view of the feed and shearing assembly, illustrating the shearing cylinder;

FIG. 22 is a cross section of the feeder shown in FIG. 21, taken along line 22—22;

DESCRIPTION OF THE PREFERRED EMBODIMENTS

Figure 1:
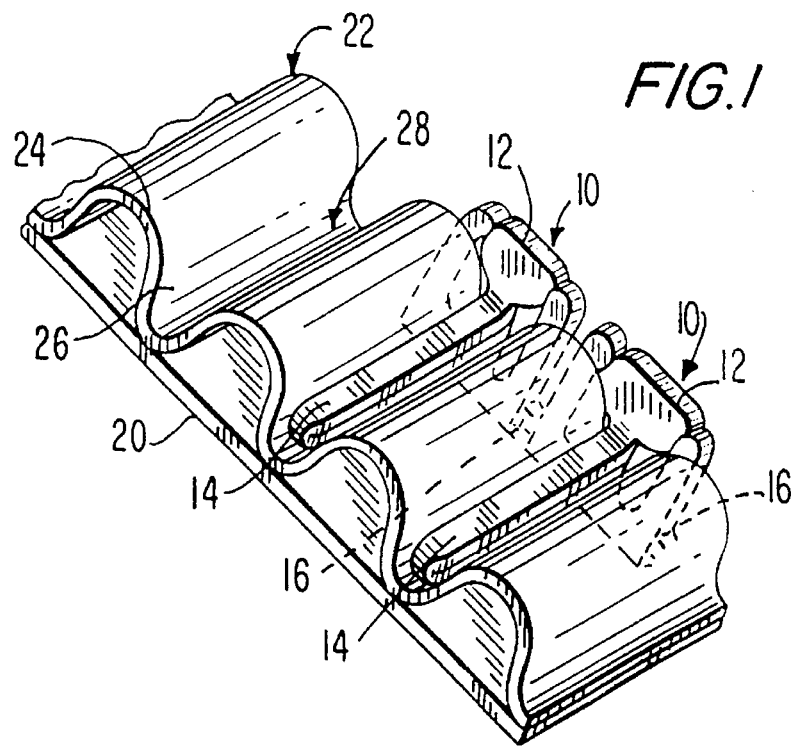
FIG. 1 is a perspective view of a section of a strip of tab-connected contacts, in the form of pins or posts, nested or contained within recesses of a corrugated carrier strip to prevent shifting of the contacts relative to each other.
Figure 2:
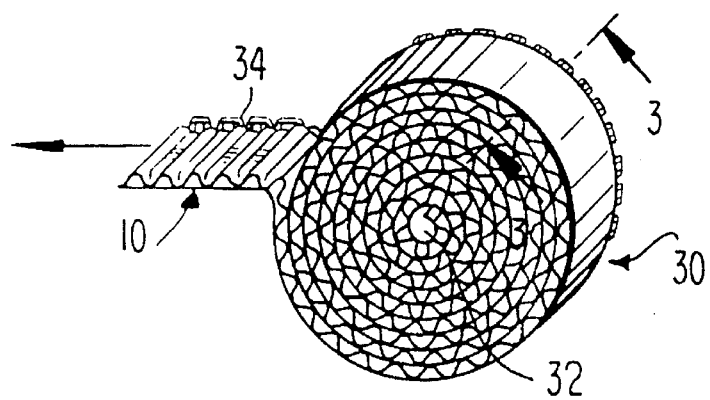
FIG. 2 is a perspective view of a spiral roll formed of a continuous strip of the type shown in FIG. 1, in which the individual strip contact pins are arranged along directions substantially parallel to the axis of the roll.
Figure 3:
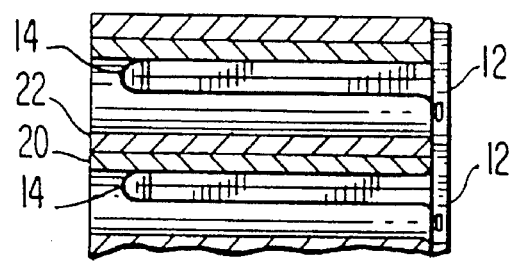
FIG. 3 is a fragmented cross-sectional view taken along line 3—3 in FIG. 2, illustrating the arrangement of surface contact pins in two adjacent layers of the spiral roll.

A new family of surface mount terminals, made in continuous chain or strip form by a stamping process and wound on a roll suitable for use in conjunction with vacuum pick-up nozzles of a component placement or pick-and-place machine, is disclosed in U.S. patent application Ser. No. 08/554,342. This new family of surface mount terminals is readily adaptable to such high speed placement machines. Besides the accuracy and repeatability in positioning the terminals at the pick-up station, substantial savings are realized by eliminating the taping of the terminals and by the simplified assembly process. Also, this new family of terminals for the first time makes it possible and practical to mount complex surface-mount terminals, such as posts, which have tall pins and relatively small bases and, therefore, a high center of gravity. While the details of the constructions of such terminals are set forth in the companion application, the basic features of one surface-mount contact or terminal are illustrated in FIGS. 1–3. The surface-mount terminal that is illustrated is a surface mountable post 10 which includes a relatively small flat base 12 from which there protrudes, in a normal direction, a pin 13. The posts are made in a continuous chain or strip form from flat sheet stock and attached to each other by connecting tabs 16.

In order to maintain the spacing and orientations of the posts, there is advantageously provided a continuous carrier strip 18 which includes a flat strip 20 to which there is attached a corrugated or undulating strip 22 as shown. The corrugated strip 22 exhibits crests or peaks 24 and throughs or low points 26 to provide receiving recesses 28 which are dimensioned and spaced from each other to receive successive pins 14. As indicated in FIGS. 2 and 3, the rolling up of the continuous carrier strip 18, with the pins received therein, secures the pins in place. When wound in a roll 30, the strip 18 has an inner end 32 substantially co-extensive with the center or axis of the roll 30 and an outer end 34 which can be received within a suitable placement machine to selectively remove the contacts or pins. Although the invention will be described in relation to a strip of surface-mount terminals wound in a roll 30, the strip 18 can also assume other configurations such as straight length or fan-fold.

Figure 4:
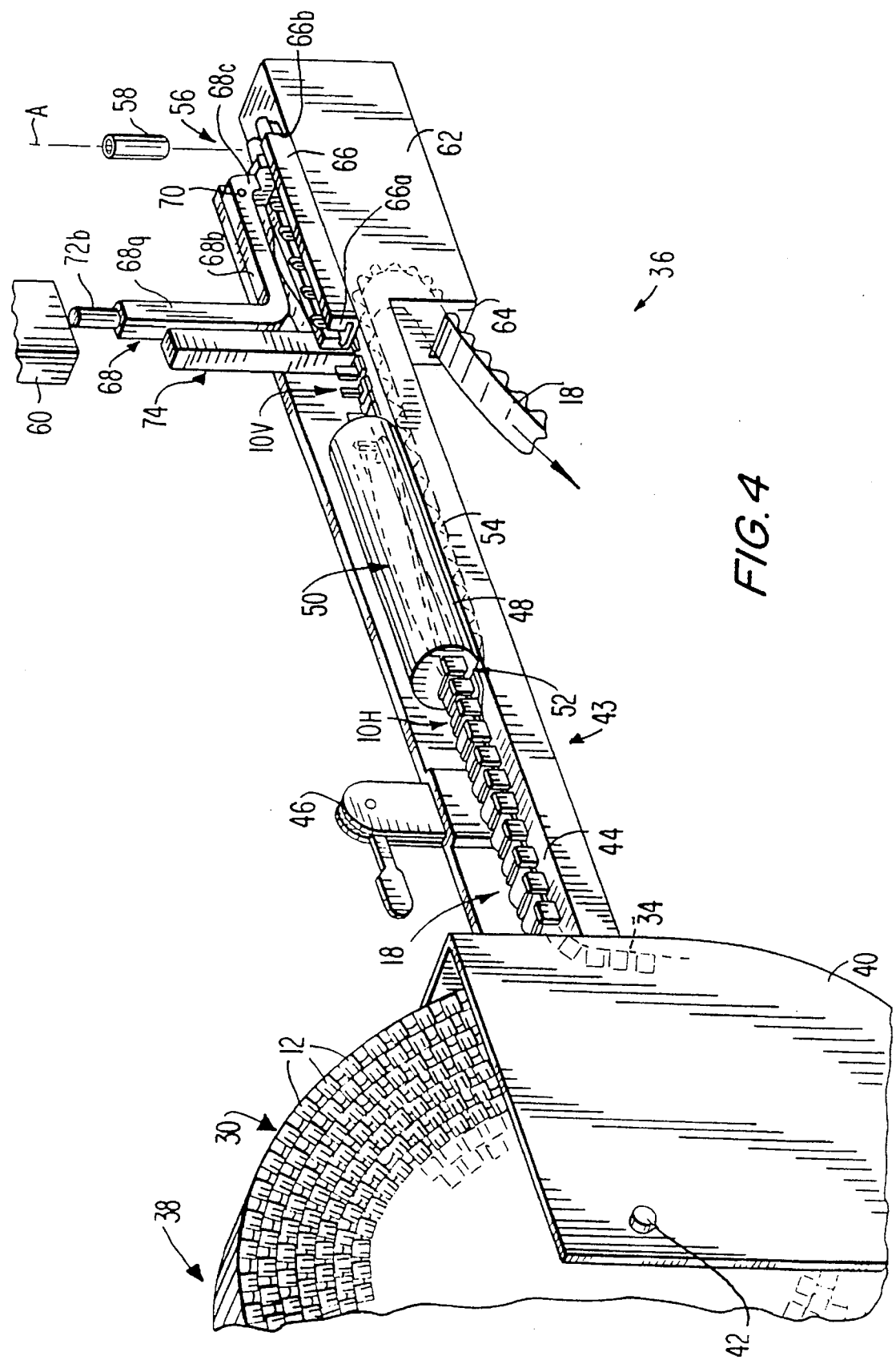
FIG. 4 is perspective schematic view of a feeder in accordance with the present invention, shown receiving surface mounted pins from a reel or spool of the type shown in FIG. 2.

The feeder in accordance with the invention will now be described in conjunction with the drawings, in which identical or similar parts are designated by the same reference numerals throughout, and first referring to FIG. 4, the feeder is generally designated by the reference numeral 36. The feeder 36 includes a supply station 38 which, as noted previously, is in the form of a spiral roll or spool 30 of surface mount posts 10 in which successive layers or windings of the posts are suitably separated from each other by the continuous carrier strip 18 to essentially dispose all the bases 12 of such posts in a common plane. As viewed in FIG. 4, the pins or pin portions 14 of the posts 10 are arranged substantially horizontally when the axis of the roll 30 is oriented horizontally.

In order to dispense the contacts or posts 10, there is provided a housing or receiving structure which at least partially receives the reel or spool 30 and a horizontal shaft 42 is provided which extends through the center or axis 32 of the roll (FIG. 2). The roll can rotate within the housing 40 about the shaft 42. The outer end 34 of the strip is received within an intermediate transport station 43 and moved along a transport surface 44 as shown. A locking device 46 can be used to lock the feeder 36 to the frame of the pick-and-place machine.

The transport station 43 is used for transporting the strip of posts 10 from the supply station 38 with at least the leading surface-mount contact being oriented along a predetermined or desired direction corresponding to a vertical axis A at a downstream pick up station. In the embodiment shown, the pins are unwound from reel 30 while initially oriented in a horizontal direction. However, the pins need to be re-oriented in a vertical direction aligned with axis A at the pick-up station, as will be described hereinafter. For this purpose, there is provided a tubular member 48 which has a twisted axial slot 50 therein, the cross-section of the slot 50 generally conforming to the shape of the surface mount contacts so that the contacts can enter the tubular member 38 with one orientation and exit with another orientation, depending on the degree of twist of the slot 50. The embodiment being described re-orients the pins 90° so that the horizontal posts 10H enter horizontally and the exiting posts 10V leave vertically. The reorienting device 48 need only be used when reorienting the contacts is desired or necessary. With regard to certain contacts, if these are arranged in the reel 30 in their final desired orientations, the re-orienting device 48 can be omitted or bypassed.

Upstream of the tubular member 48, there is provided a deflecting plate 52 which separates the strip of posts 10 from the carrier strip 18 and deflects the carrier strip 18 so that the strip of pins enters the tubular member 48 while the carrier strip 18 is deflected below the tubular member 48 and moves through a carrier guide or slot 54.

The feeder 36 is mounted on a pick-and-place machine so that the end contact of the strip is guided to a pick-up station 56 along the vertical axis A which defines the path of movement a vacuum nozzle 58 which moves up and down during operation to pick up components and move them to and deposit them onto a printed circuit board (not shown). Also located at the pick-up station is an actuator 60, which is part of the pick-and-place machines, for actuating the feeder 36 when the pick-and-place machine is ready to pick up a surface-mount contact oriented along the predetermined direction at the pick-up station. The actuator 60 in FIG. 4 is a mechanical actuator in the form of a press which reciprocates upwardly and downwardly to actuate the feeder.

The feeder includes a fixed block 62 which has an exit opening 64 through which the carrier strip 18 can be released and discarded. Mounted on the fixed block 62 is a guide 66 for guiding the advancing contacts, the guide including a channel which substantially conforms to the shape of the contacts so that the positions and orientations of the contacts can be precisely controlled when the contacts enter into the guide 66 at the input end 66a until they exit the output end 66b. By intermittently advancing the strip of contacts, as will be described hereinafter, a leading surface-mount contact at the downstream end of the strip is moved beyond the output end 66b of the guide 66 into vertical alignment with the axis A or path of movement of the vacuum nozzle 58. The desired or predetermined direction of the contact at the pick-up station is assured by the guide 66 and is maintained by the connecting tab 16' (FIG. 10) notwithstanding that the contact has moved beyond the output end 66b and is suspended without additional support.

Figure 8:
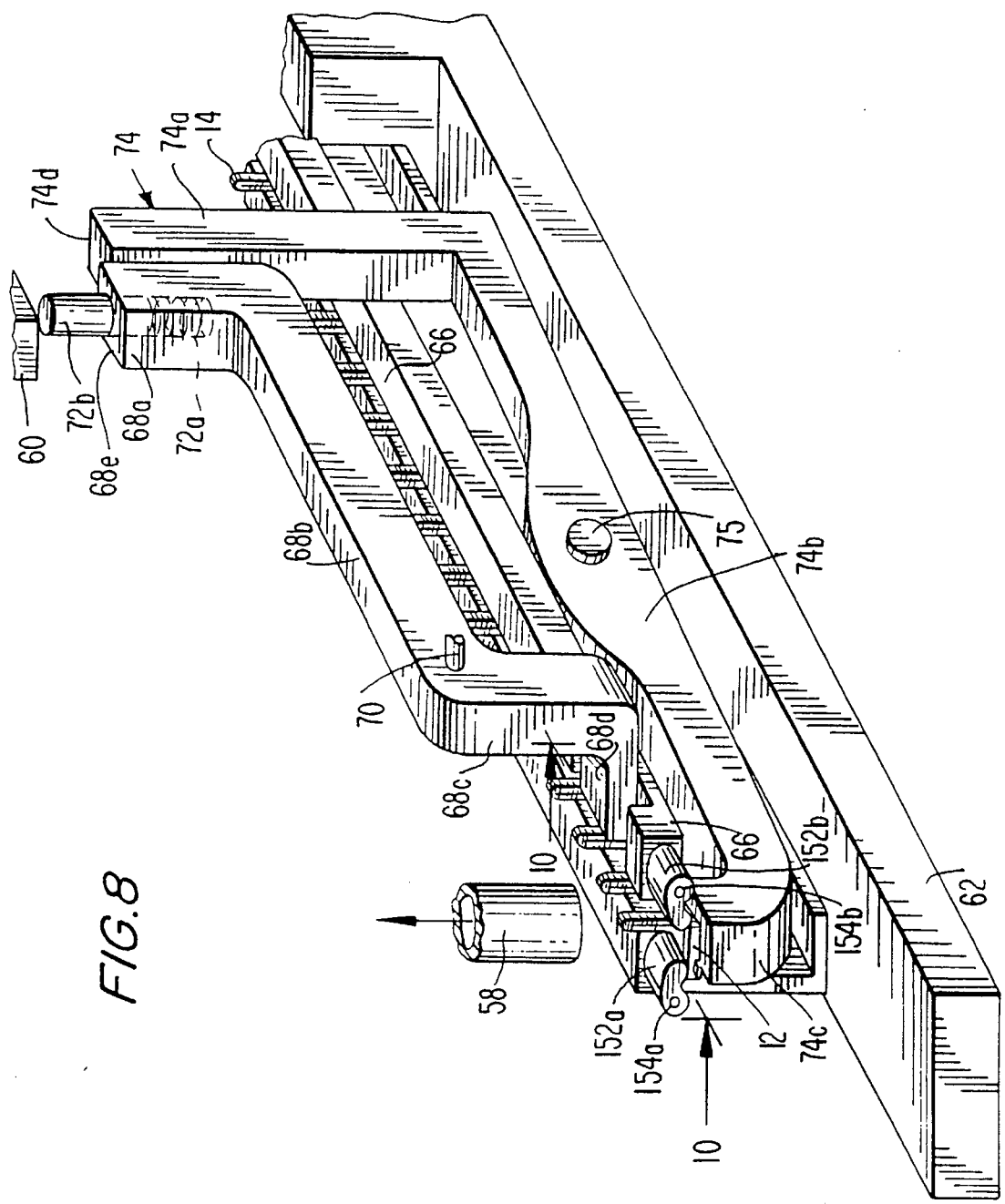
FIG. 8 is a perspective view of the front end of the feeder shown in FIG. 4, illustrating the pivots for the advancing and shearing levers and also showing a different embodiment of the holding fingers.
Figure 10:
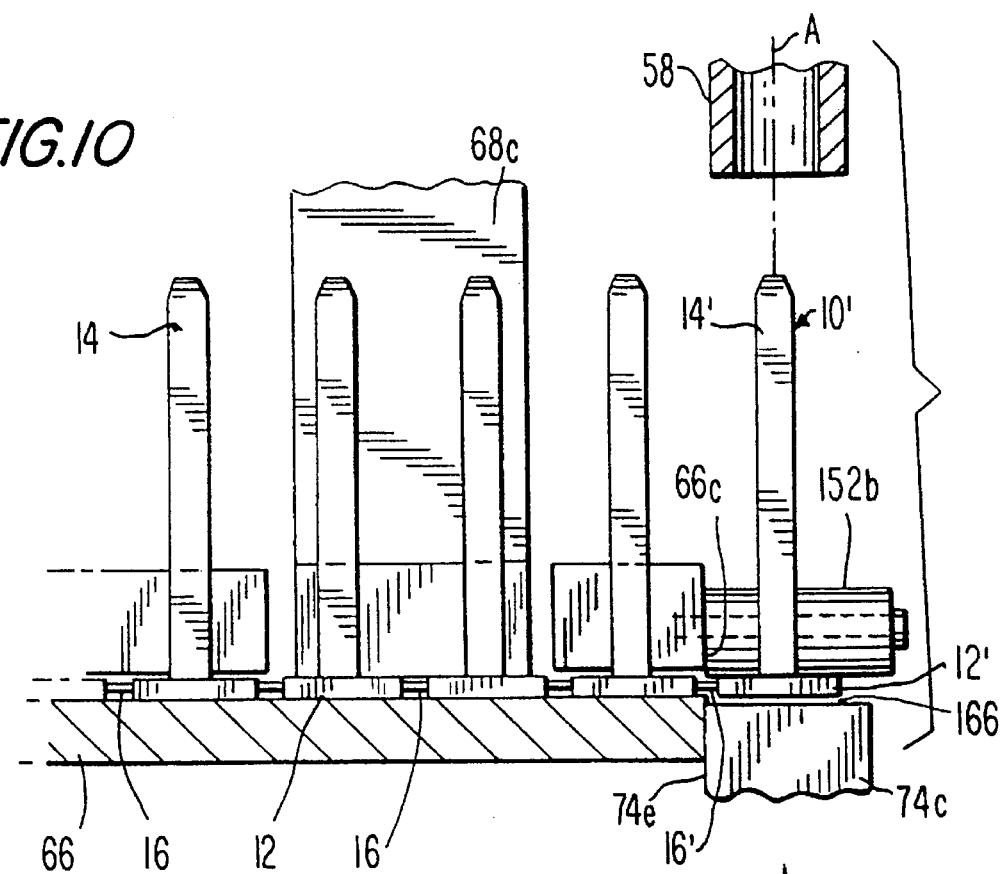
FIG. 10 is a side elevational view of the feeder shown in FIGS. 4 and 8, taken along a section which shows the details of the shearing plate or cutting element in relation to the transport guide through which the pins travel towards the pick-up station.

Intermittent operation of the feeder 36, upon demand by the pick-and-place machine and the corresponding actuation by mechanical actuator 60, includes actuation of an advancing lever 68 having an upright or vertical portion 68a, a horizontal portion 68b and a downwardly depending vertical portion 68c is pivoted about pivot pin or shaft 70. The advancing lever 68 is spring loaded by a suitable spring (not shown) which biases the lever 68 in a clockwise direction, as viewed in FIG. 4. As best shown in FIGS. 8 and 10, such biassing causes the portion or leg 68c to move downwardly and abut against at least a portion of the bases 12 of at least one or two contacts of the strip portion within the guide 66 to prevent the strip of contacts from moving until the pick-and-place machine demands a contact and cycles the feeder. The upper end of the vertical portion 68a has an upper surface 68e which has a vertical bore into which there is mounted a compression spring 72a which acts on plunger 72b which can be telescopically forced into the bore when the pressure applied by the mechanical actuator 60 exceeds a predetermined threshold pressure.

A shearing lever 74 is best illustrated in FIG. 8 and includes an upright portion 74a, a horizontal portion 74b and upwardly directed vertical portion or cutting element 74c, the upright portion 74a having an upper surface 74d. The shearing lever is also pivoted about a pivot pin 75, both levers 68 and 74 having stops (not shown) which limit the degree or extent of rotational or pivoting movements of these levers about their respective pivot pins.

Figure 11:
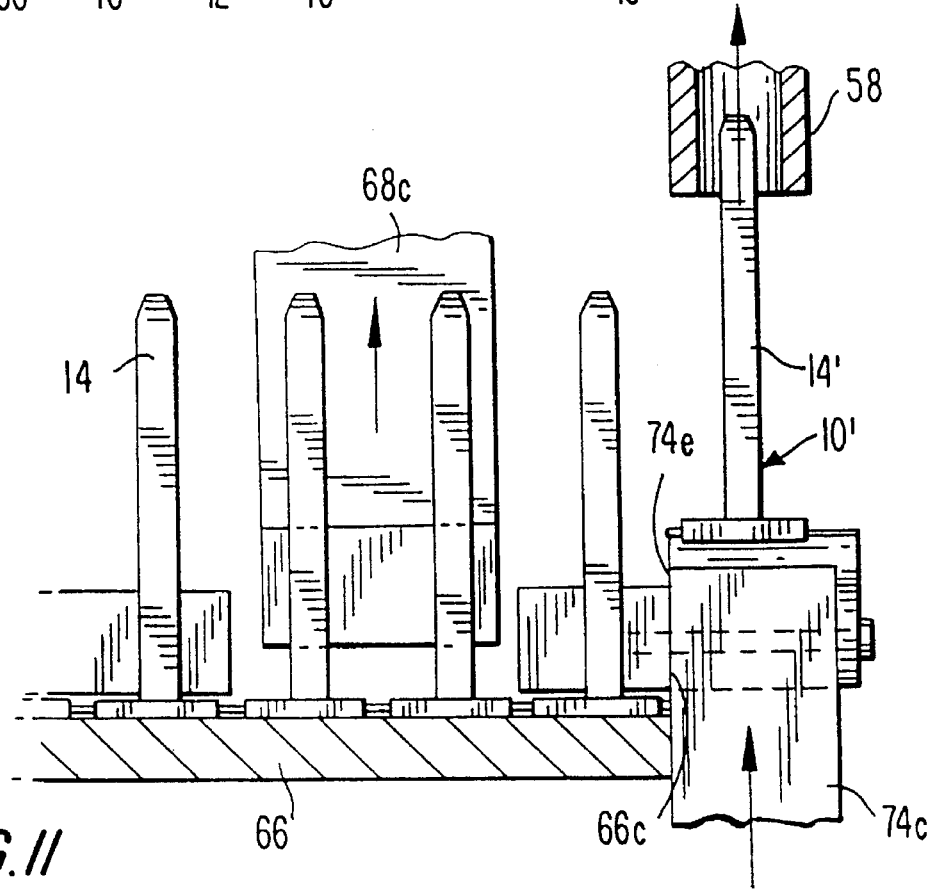
FIG. 11 is similar to FIG. 10, but shows an upper position of the cutting element, corresponding to the positions shown in FIGS. 7 and 9C, and further illustrates the vacuum pick-up nozzle in a position to assume successful pick up of the pin.

As best shown in FIG. 8, the spring loaded pin or plunger 72b projects above the lever surfaces 68e and 74d. Initially, the surface 68e rises above the surface 74d. With such an arrangement, a downward stroke of the mechanical actuator 60 initially engages the plunger or pin 72b. However, the spring constant of the spring 72a is selected such that downward pressure on the pin or plunger 72b causes the advancing lever 68 to pivot about the pivot pin 70 against the action of the biassing spring (not shown) which urges the lever to pivot as aforementioned prior to actuation. Pivoting of the advancing lever 68 continues until the surface 68e is below the surface 74d. At such time that the advancing lever 68 contacts its associated stop, the pin or plunger 72b is forced into the bore against the action of the spring 72a until the actuator contacts and applies a downward force on the surface 74d of the cutting or shearing lever 74. This causes the cutting element 74c to move upwardly and sever one or more connecting tabs also attached to the immediately successive upstream surface mount contact which is still positioned within the guide 66 channel. This cutting action is best illustrated in FIGS. 10 and 11.

In FIG. 10, the leading surface-mount contact 10' is shown suspended beyond the guide 66 and maintained in its desired orientation and direction by connecting tab 16' which bridges between the guide 66 and the cutting element 74c. The pin 14' is shown aligned along the axis A which defines the path of movement of the pick up vacuum nozzle 58. With the vacuum nozzle 58 initially in an upper position, the vertical portion 68c abuts against the bases 12 of the strip of the connected contacts to prevent slidings movements of the strip within the guide 66. The shearing portion or cutting element 74c includes a cutting edge 74e which is initially positioned below the tab 16', while the guide 66 includes a cutting edge 66c (See also FIG. 10) which is positioned above the tab 16'. When the cutting element 74c is actuated upwardly, as shown in FIG. 11, the cutting edge 74e moves upwardly past the stationary cutting edge 66c to thereby sever the connecting tab 16' and carry the contact 10' upwardly to provide engagement between the vacuum nozzle 58 and the pin 14'. Therefore, the sequence of operations resulting from a downward movement of the mechanical actuator 60 includes initial movement of the advancing lever or arm 68 with attendant raising of vertical portion 68c and optional horizontal gripping portion 68d (FIG. 8) and advancement of the strip, as to be described. Continued downward movement of the mechanical actuator 60 results in cutting of the end contact 10' from the strip, as aforementioned, and moves it into proximity of the pick up nozzle 58. On reverse or upward travel by the mechanical actuator 60, the cutting or shearing lever 74 is initially released causing the cutting element 74c to be lowered by the action of appropriate loading spring (not shown). The advancing lever 68 is then released and reverts to its initial position wherein the gripping portion 68d again presses downwardly on the bases 12 within the guide 66.

One example will now be given for intermittently advancing the strip of contacts. Referring to FIGS. 5A and 5B, a stationary pawl 76 is mounted for pivoting about pin 78 and has a slot 80 within which there is captured a fixed pin 82. The pin 82 limits the extent of pivoting of the pawl 76 about the pin 78. Normally, the pawl 76 is positioned in the lower position (as shown in solid outline in FIG. 5A) in which transverse edge 84 is arranged substantially normal to the direction of travel of the pins within the guide. The pawl 76 also has an inclined edge 86 as shown. It should be clear that with this arrangement the edges 84 and 86 only allow the strip to move in a forward direction, as indicated by the arrow, and not in an opposite direction. During forward advancement, the pins abut against the inclined edge and urge the pawl upwardly against the action of the spring 88. As soon as a pin has passed, however, the pawl is again forced downwardly so that the edge 84 is positioned behind the pin to prevent any backward movement.

Actual advancement of the strip of contacts is provided by a movable block 90 on which there is mounted a sliding pawl 92 which is similarly configured and mounted as is the pawl 76. The pawl 92 is mounted on a pivot pin 94 and has a slot 96 which captures a pivot pin 98. The pawl 92 has a transverse edge 100 and an inclined edge 102, and is biassed upwardly by spring 104 to the position shown in solid outline. When the movable block 90 is moved forwardly by piston or rod 106, this also advances the pawl 92 which pushes the strip of contacts with the transverse edge 100. However, when the block 90 is moved back to its original position, the pawl 92 pivots in a clockwise direction as a now fixed pin rides on the inclined edge 102, compressing the spring 104, until the pawl clears the pin and is urged by the spring 104 behind the next succeeding pin. Any friction between a pin and the inclined surface 102 which would tend to move the strip rearwardly is prevented by the stationary pawl 76 which engages one of the pins of the strip with the transverse edge 84.

In FIG. 5B, one example is shown by which the movable block 90 can be reciprocated in response to pivoting action of the advancing lever 68 about the pivot pin 70. The block is provided with a transverse slot 108 and the downwardly extending portion 68c of the advancing lever is provided with a rounded end 110 which is captured within the slot 108. Clearly, pivoting of the advancing lever will be translated into linear reciprocal movements of the movable block 90.

Figure 6:
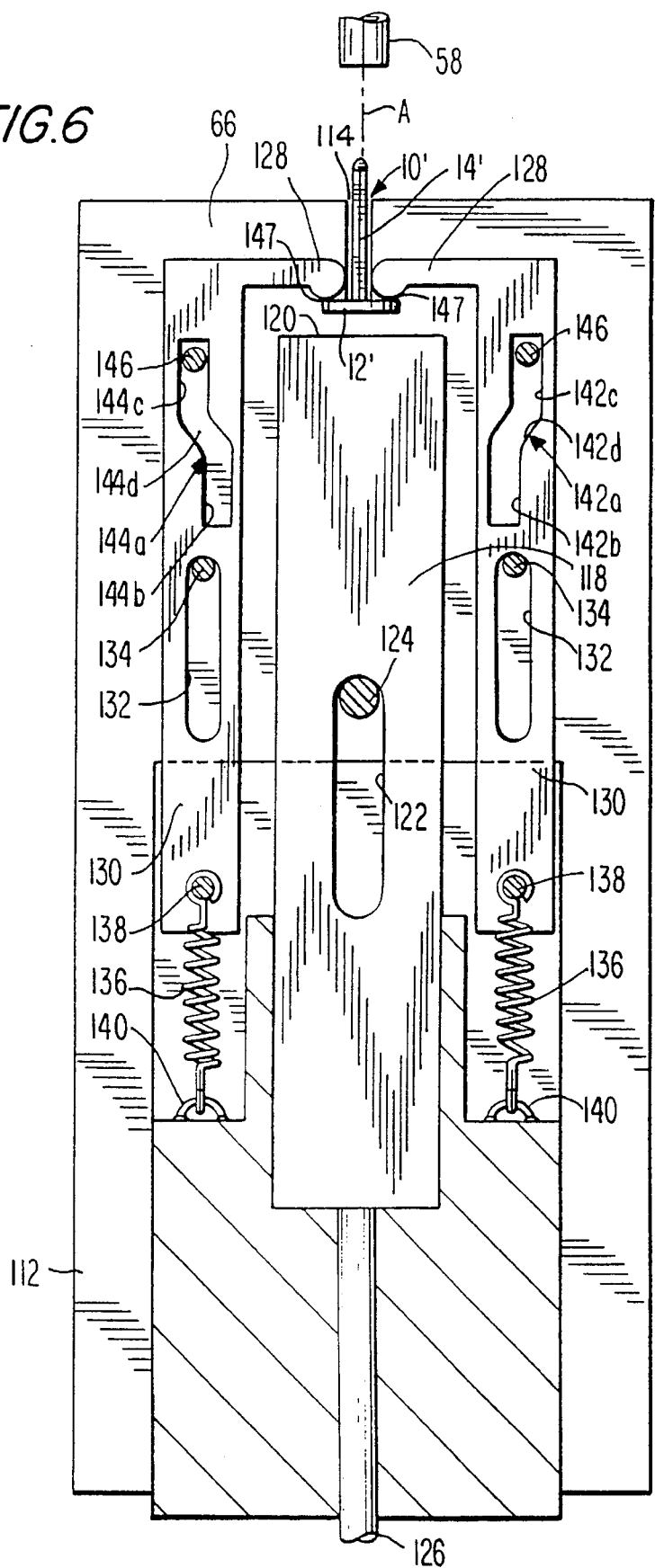
FIG. 6 is a front elevational view, partially in cross-section, illustrating one embodiment of holding or clamping fingers for securing the position of a contact upon being severed from the strip, shown prior to severance of the contact.
Figure 7:
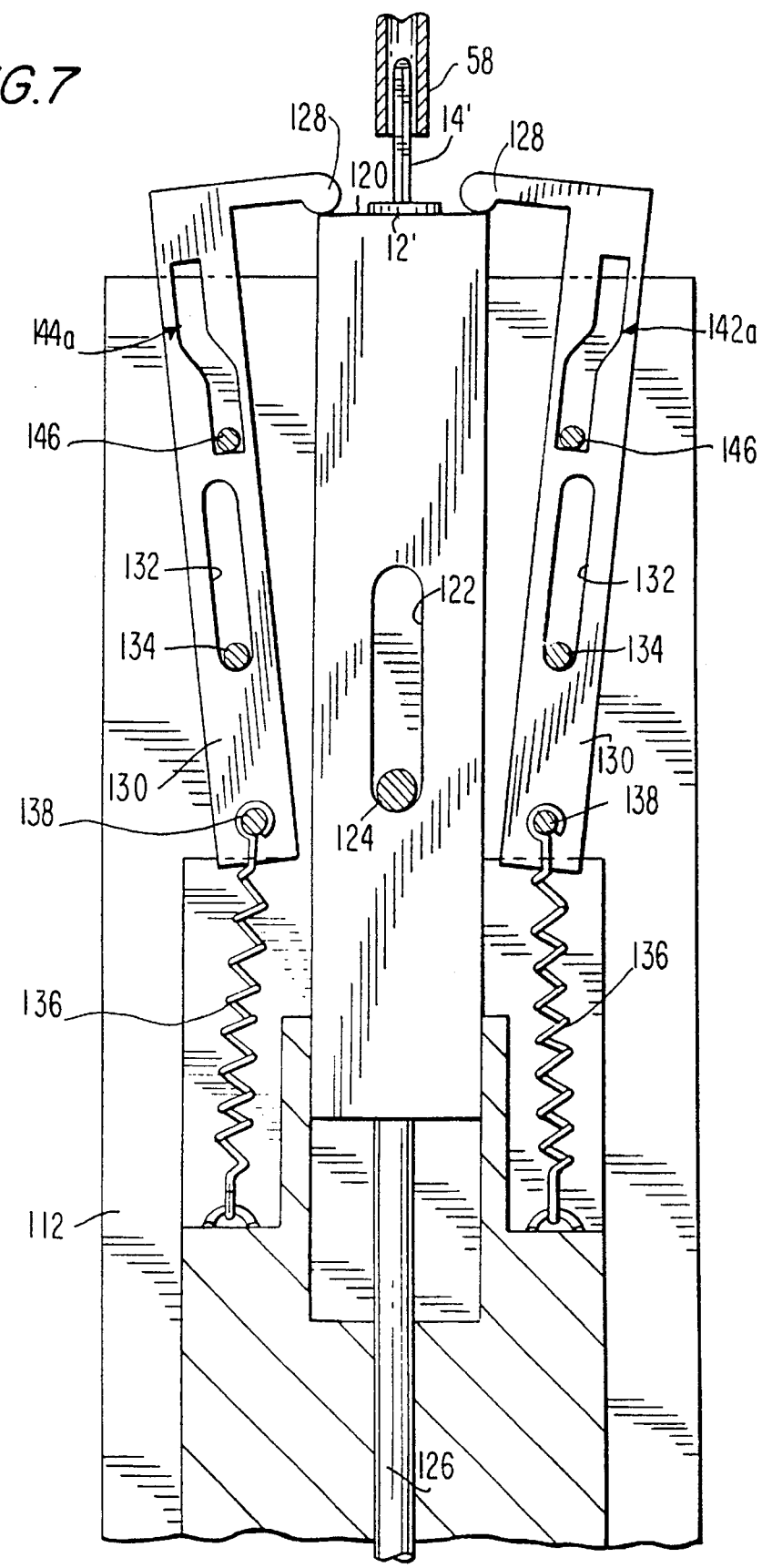
FIG. 7 is similar to FIG. 6, but showing the cutting element in its uppermost position and camming slots on the plates, on which the holding fingers are mounted, deflected radially outwardly to release the surface-mount contact at a point when the vacuum nozzle of the pick-and-place machine has sufficiently engaged the contact to insure successful pick up by the nozzle.

An important feature of the present invention is to provide a holding mechanism for temporarily holding the leading surface-mount contact 10' to maintain its predetermined or desired direction and position after it is severed from the strip until the time that the pick-up member or vacuum nozzle 58 has engaged the contact sufficiently to enable it to pick the contact and remove it from the pick-up station. The specific hold down mechanism used is not critical. Referring to FIGS. 6 and 7, one example of a mechanism for selectively holding down a severed contact is illustrated. In FIG. 6, the reference numeral 112 represents an end surface of a guide block similar to block 62 suggested in FIGS. 4 and 18, the end contact 10' being essentially suspended and held in place by its connecting tab after it has been moved outside of or beyond the guide 66. A clearance 114 allows the contact to freely move to a position outside of the guide, where the contact is aligned with the axis A of the vacuum nozzle 58. In this embodiment, the cutting is performed by a cutting or shearing element 118 which has an upper cutting edge 120, corresponding to cutting edge 74e of the vertical portion 74c. The upper and lower positions of the cutting element 118 are limited by vertical slot 122 and captured pin 124 as shown. In FIG. 6, the cutting element 118 is shown in its lower most position before it engages the suspended contact 10' and before it severs the connecting tab. The movements of the cutting element 118 are actuated by piston or shaft 126 which can be mechanically, electrically or hydraulically controlled by means well known to those skilled in the art.

Disposed on each side of the contact 10' is a clamping or holding finger 128 positioned above the base 12' of the suspended pin. Each of the holding fingers 128 is connected to a vertical plate 130, each of which is mounted for vertical slidable movement along the surface 112, such movements being limited by means of vertical slots 132 which capture stationary pins 134. The plates 130 are biassed downwardly by tension springs 136 which are connected to the plates by means of pins or rivets 138 at one end and fixed to the block 62 at the other end at 140. Between the slots 132 and the clamping fingers 128, there are provided stepped slots 142a and 144a as shown. The slot 142a has two vertical portions 142b and 142c which are offset relative to each other in relation to the axis A and joined by a smooth transitory portion 142d. Similarly, the slot 144a is provided with offset vertical slot portions 144b and 144c joined by transitory slot portion 144d. The lower slot portions 142b and 144b are positioned closer to the axis A and substantially aligned with the slots 132 while the upper portions 142c and 144c are spaced further from the axis. The pins 146 are also spaced further outwardly in relation to the axis A then the pins 134, all said pins being arranged so that when the clamping plates 130 are in their lower most positions shown in FIG. 6, the plates are substantially vertical and parallel.

Referring to FIG. 7, when an upward force is applied to the piston or rod 126, the cutting element 118 is moved upwardly, the shearing edge 120 moving beyond the cutting edge 66c of the guide (shown in phantom outline in FIG. 7) thereby severing the connecting tab 16'. Although there is initial clearance 147 between the holding fingers 128 and the base 12', as soon as the cutting element 118 moves upwardly, the holding fingers engage the base 12' and urge it against the cutting element thereby preventing its movements and assuring its desired position and orientation. As the cutting element 118 continues its upward travel, the slots 142a, 144a on the respective plates 130 are moved upwardly and the pins 146 move from the outer slot portions 142c, 144c to the inner slot portions 142b, 144b. Since the pins 146 are fixed, this causes the plates 130 to pivot about the fixed pins 134 and to separate at the upper ends as shown in FIG. 7, the holding fingers eventually sliding off and releasing the base 12' of the secured post or contact. However, at such time that this occurs, the post has already has moved sufficiently upwardly and the vacuum nozzle 58 has moved sufficiently downwardly so that the pick-and-place machine has engaged a contact sufficiently to enable it to pick up the contact and remove it from the pick-up station. The springs 136 are tensioned in FIG. 7 and, as soon as the force is removed from the rod 126, the springs 136 return the plates 30 to the positions shown in FIG. 6. The rate and precise timing at which the holding fingers 128 move off the base 12' can be controlled by the positions of the slots 142a, 144a and the positions of the transitory slot portions 142d, 144d. Thus, the release of the base 12' by the holding fingers 128 can be controlled in relation to the position of the cutting element 118 and, therefore, the relative positions between the contact 10' to be picked up and the vacuum nozzle 58.

Figure 9:
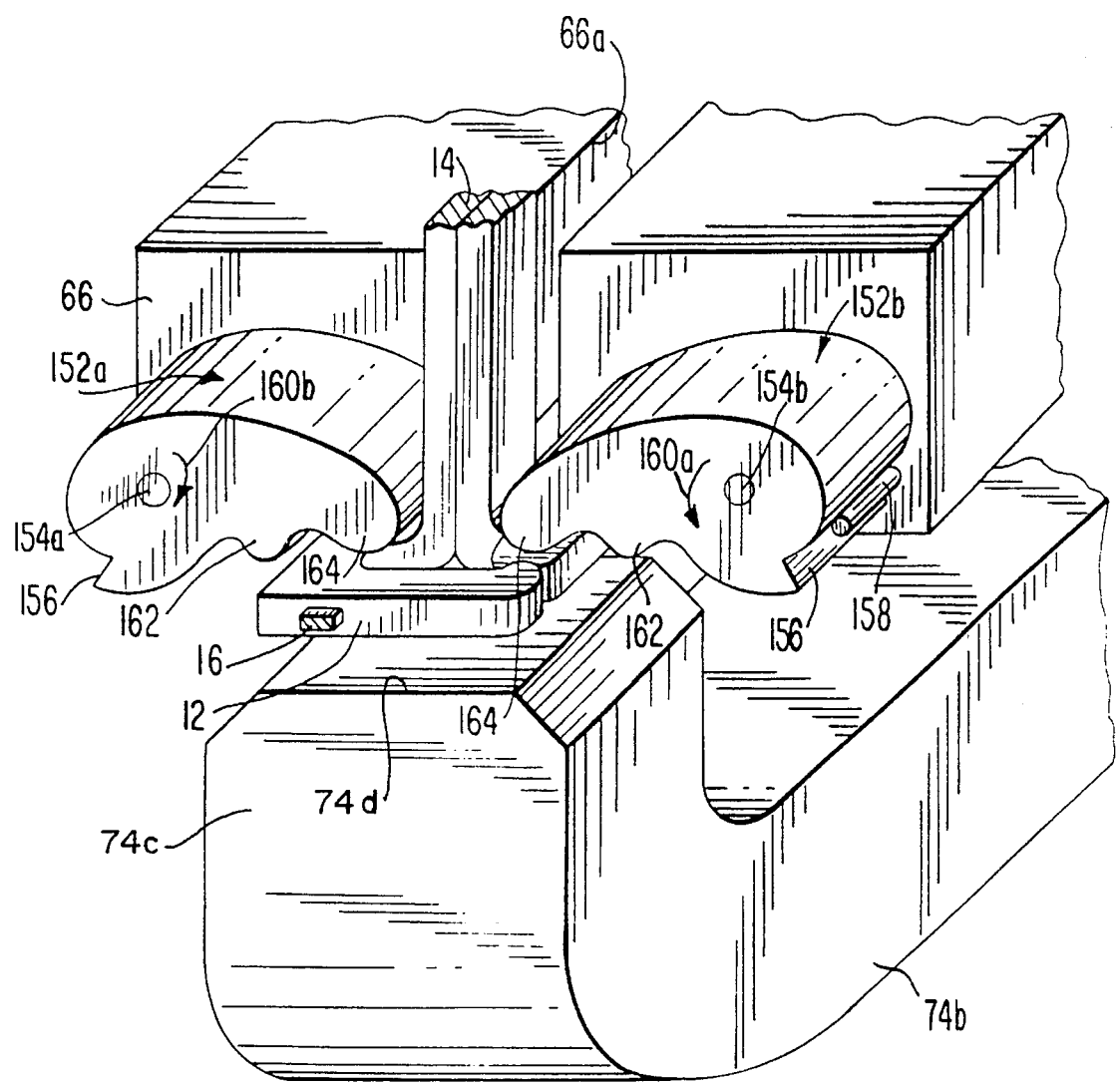
FIG. 9 is an exploded view of the pick-up station shown in FIG. 8, illustrating cammed holding fingers in contact holding positions when the contact is first severed from the rest of the strip.

Referring to FIG. 8, another form of holding or clamping fingers are illustrated and designated by the reference numerals 152a and 152b. Such holding fingers will be more fully described in connection with FIG. 9-9C. The holding fingers 152a, 152b are bean or kidney shaped as shown and mounted for pivoting or rotating movements about respective pivot pins or shafts 154a, 154b. The holding fingers are spring loaded or biassed so that the holding finger 152a rotates in a clockwise direction as indicated by arrow 160b and the holding finger 152b is rotated in a counterclockwise direction as indicated by the arrow 160a. In order to limit excessive movements of the holding fingers as aforementioned, each of the holding fingers is provided with a stop surface 156 which engages a stop pin 158 to limit the amount of rotation, due to spring loading, to the positions shown in FIG. 9. Each of the holding fingers preferably includes a cam surface 162 between the pivoted ends and the inner-most holding portions or ends 164. The positions of the stop surfaces 160 and stop pins 158 are selected so that the holding ends 164 are positioned slightly above the base 12' of the post 10' so as to provide a clearance similar to the clearance 147 in FIG. 6. This allows the post to move freely from the slot of the guide 66 to the position aligned with the vacuum nozzle along axis A without interference from the fingers.

Figure 9A:
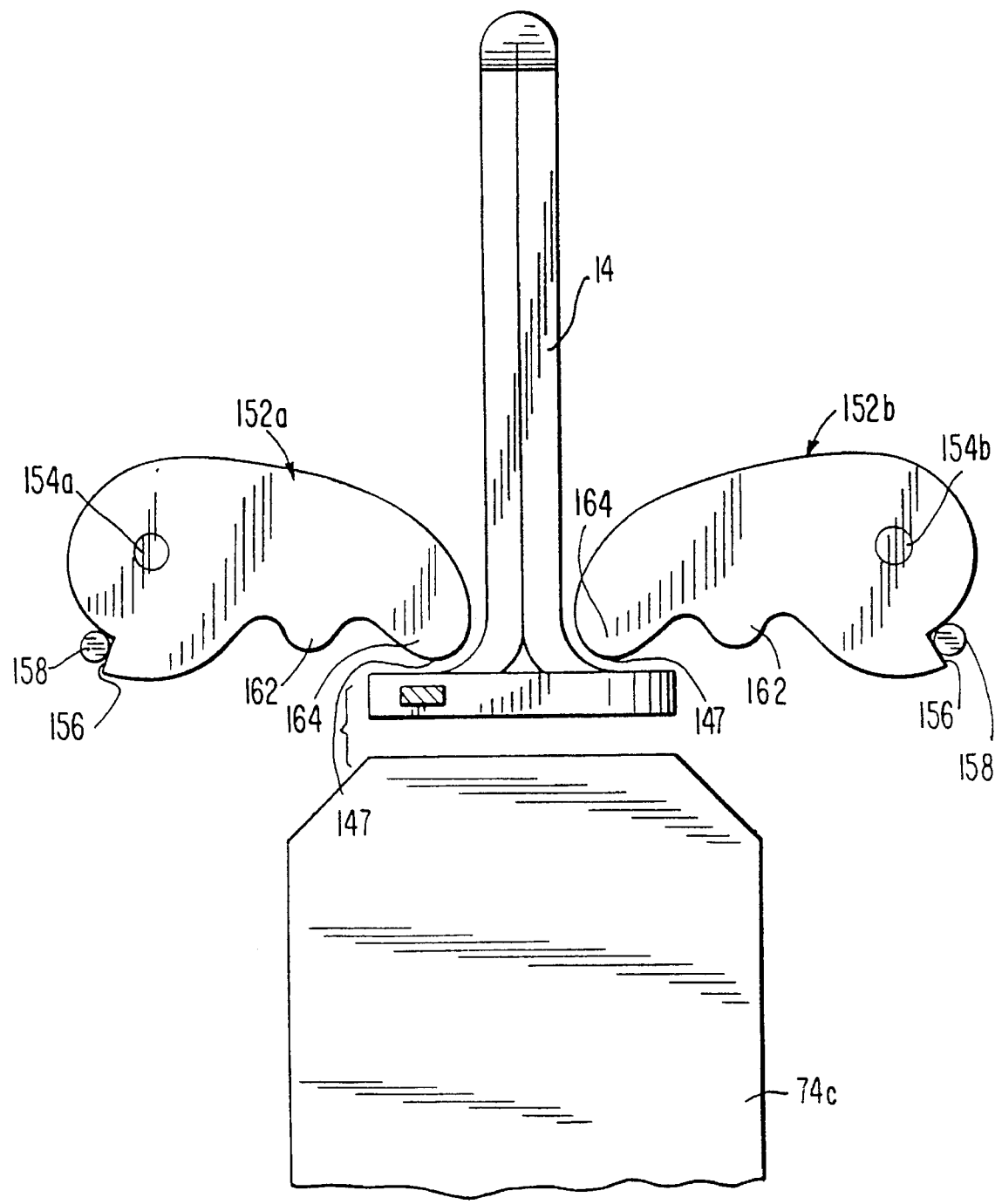
FIG. 9A is a front elevational view of the pick-up station shown in FIG. 9, showing the position of the holding or clamping fingers prior to upward movement to the cutting element when the end contact to be severed is suspended by its strip-connecting tab at the pick-up station.

As with the plates 30 in FIGS. 6 and 7, once the cutting element 74c begins to move upwardly and the base 12 is raised, the base comes into contact with the holding ends 164 just about the time that the connecting tab 16' is severed so that the contact 10' is secured in place at its desired position and orientation. The initial position showing the clearance 147 is better indicated in FIG. 9A. In FIG. 9B, the cutting element 74c has been raised sufficiently so that the holding ends 164 engage the upper surface of the base 12' and the stop surfaces 156 have moved away from their associated stop pins 158. In FIG. 9C, the cutting element has been raised sufficiently to raise the post to a point where engagement with the vacuum nozzle 58 is assured. At such point, the holding ends 164 separate from or move off of the base 12'. As with the plates 130, the speed and point at which the holding fingers 152a, 152b release the contact can be regulated or controlled by selecting the shape, size and orientations of the cams 162 and the camming surfaces 74d. As soon as the cutting element 74c is again lowered, the spring-loaded holding fingers rotate about their respective pins to revert to the initial positions shown in FIG. 9A.

Figure 12:
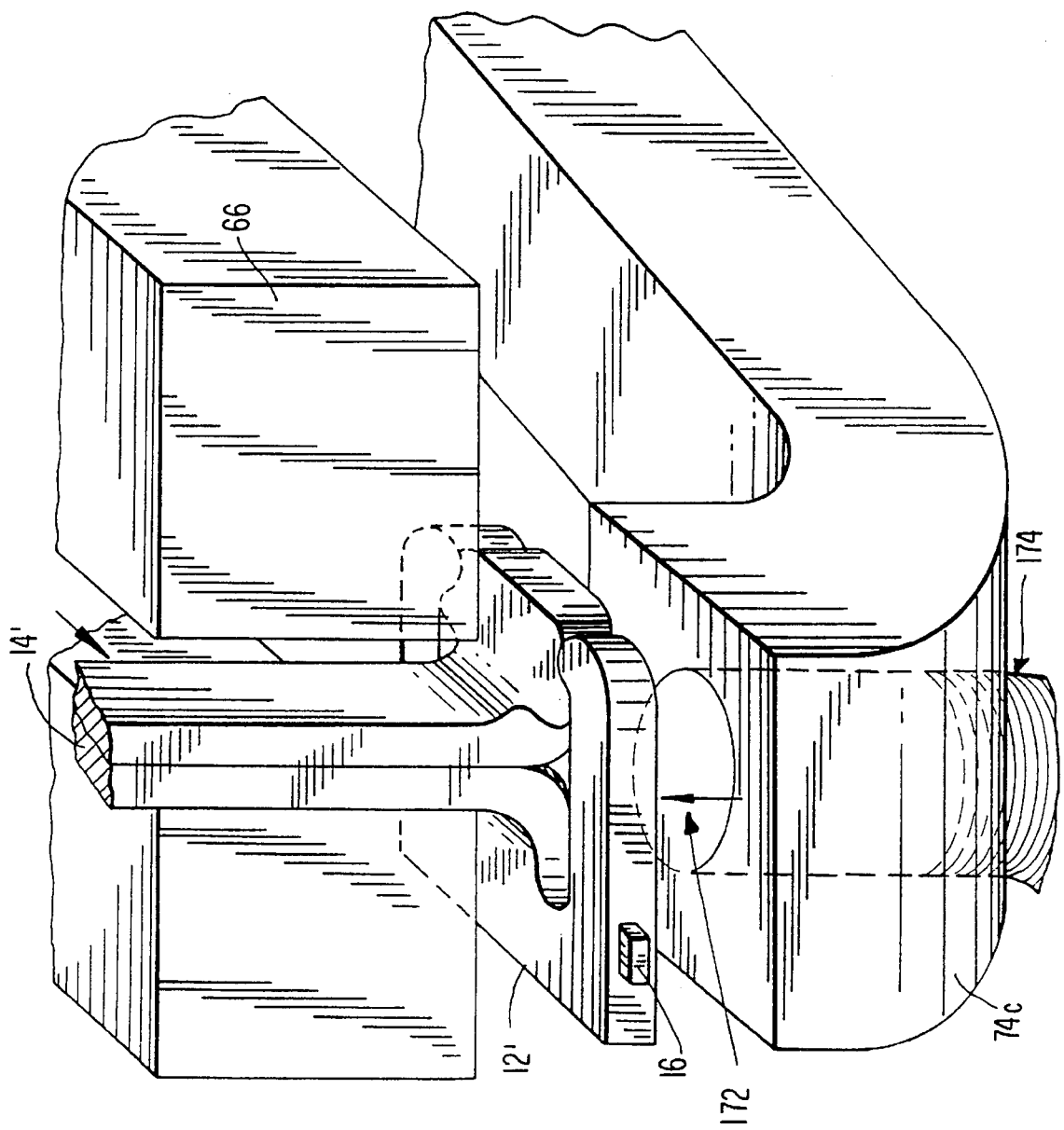
FIG. 12 is similar to FIG. 9, but shows an alternate embodiment for holding the severed pins which uses a vacuum suction on the base of the pin instead of the holding or clamping fingers.

In FIG. 12, a further embodiment of a hold down or clamping mechanism is shown in which the cutting element 74c is provided with a vacuum hole 172 which is in fluid flow communication with a flexible vacuum hose 174. As soon as the cutting element 74c begins to move upwardly, and the upper surface 74e comes into contact with the lower surface of the base 12', the vacuum applied at the hole 172 maintains the post in place on the surface 74e as the cutting element 74c raises the contact to the engaging position with a vacuum nozzle 58. The hole 172 and the vacuum formed therein, therefore, can hold the post down at the upstroke while cutting or shearing takes place while debris generated during shearing can be removed through the vacuum hole at 172.

The feeder of the present invention, however, in combination with stamped contacts in strip form disclosed in application Ser. No. 08/554,342 provide a new connector system which is extremely versatile and can feed, separate and present continuous format surface mountable contacts to the vacuum pick-up head of practically any component placement system. Unlike other feeding systems, the system described above allows stamped contacts to be supplied on continuous reels without the need to remove expensive, wasteful and environmentally dangerous pre-packaging materials. Additionally, extra production equipment is unnecessary as the feeder operates with virtually any existing component placement system.

The easily integrated system consists of a surface-mount component feeder and continuous contacts or connectors such as pins, posts, quick disconnects, IDC's, test points and receptacles. The feeders are interchangeable with other surface mounted component feeders in the component placement system.

An important feature of the present invention is that the surface-mount terminals can be placed with standard placement machines (i.e. flex cells or chip shooters). Therefore, the elimination of the through-hole manufacturing process (including machines, labor and processing time) leads to significant cost reduction. Other significant savings are realized by eliminating the need for component taping. This is achieved by taking advantage of the stamping process by making the contacts in continuous chain or strip form. Precise positioning of surface-mount components of this type with the vacuum nozzles is made possible for the first time, eliminating waste due to damaged contacts and damage to the pick up nozzles.

Although the present invention has been described in connection with preferred embodiments thereof with reference to the accompanying drawings, it is to be noted that various changes and modifications will be apparent to those skilled in the art. Such changes and modifications are to be understood as included within the scope of the present invention. Thus, the actuator 60 described as cooperating with the feeder of the present invention is typically a mechanical actuator used on high speed "chip shooter" pick-and-place machines. Such machines typically mount relatively flat surface-mount components and can do so at a very high rate or speed. However, the feeder can be used with flexible cell machines which tend to be smaller and are used to mount a greater variety of components, including more complex units which have many leads, larger components, etc. where precise positioning and placement is more critical. Such flexible cell pick-and-place machines typically use, instead of mechanical actuators as described above, electric switches, sensors and the like to more accurately and more intelligently control the placements of the components. The feeders of the present invention can be used with such machines in which case the mechanical actuator is replaced by appropriate actuating mechanisms including, but not limited to, air cylinders, hydraulic cylinders, solenoids and the like for actuating the advancing and shearing levers. With such a system, the feeder itself can be rendered more intelligent by placing a photosensor or the like to sense the presence of a suspended contact (e.g. post 10' along axis A in FIG. 10). As soon as the sensor detects the absence of a contact at the pick-up station suitable conventional control circuitry can be used to cycle the feeder by actuating the advance mechanism to advance a contact to the pick-up station. In this way, there is always a contact ready to be picked up by the vacuum nozzle. The cutting step can be effected, in such a case, by an appropriate signal generated by the pick-and-place machine which can be used to actuate the cutting or shearing elements of the feeder at such time that the vacuum nozzle is being lowered to the pick-up station.

The invention has been described in connection with contacts in the form of pins or posts. The companion application Ser. No. 08/554,342 discloses numerous other electrical contacts which can be surface mounted. The holding fingers may have to be modified in shape, size or configuration in order to conform to a surface on the contact that can be held in place while it is sheared from the strip and raised towards the vacuum nozzle. The modification of the holding fingers to accommodate contacts of specified configurations is well within the skill of those in the art.

In FIG. 13 a modified feeder 200 is illustrated which does not rely on mechanical actuations by the pick-and-place machine but is operated by a series of sensors, and a control circuit for advancing the series connected contacts to the pick-up station and shearing them in synchronism with the operation of the pick-and-place machine. The feeder 200 includes a feed and shear assembly generally designated by the reference numeral 202 for feeding and shearing the strip of surface mount contacts, the feed and shear assembly being mounted on a mounting plate 204 on which a main reel assembly 206 is also pivotally mounted, on the reel side 204a of the mounting plate 204 as shown. The mounting plate 204 advantageously is also provided with a cut-out 204b to facilitate carrying and handling of the feeder for mounting on surface mounting equipment.

Also mounted on the mounting plate 204 is a paper-pick-up assembly 208 which includes a rotably-mounted paper pick-up reel 208a which can be rotated, in the direction indicated by the arrow, by a pawl 208b, which is connected to a paper take-up cylinder 208c connected to a pawl linkage 208d as shown. The paper pick-up reel 208a is provided with an internal circumferential or circular gear (not shown) which can be engaged by the pawl 208b, so that each actuation of the cylinder 208c causes the reel 208a to move in incremental angular rotation in the direction indicated by the arrow. A hub inside the reel 208a (not shown) is preferably provided with an axial slot to allow an end of the a paper tape to be secured as the reel rotates to wind the paper on the reel.

Cooperating with the paper pick-up assembly 208, there is provided a pin tensioning assembly 209 which includes a bracket 209a pivotally mounted on the mounting plate 204, which bracket supports a tensioning roller 209b which forms a circumferentially guide for receiving a strip of surface mount contacts, the moving strip of such contacts rotating the roller 209b in a clockwise direction as indicated by the arrow in FIG. 13. A tension sensor 209c is mounted on the mounting plate 204 (FIG. 14). It will be clear that movement of the bracket 209a to the position indicated by the phantom outline covers the sensor 209c, while movement of the bracket to the upper position, as indicated in solid outline, exposes the sensor. The position of the bracket, which is biased upwardly to expose the sensor under normal conditions moves down to cover the sensor when the tension in the strip of surface mount contacts exceeds a predetermined level. As will be more fully discussed below, a signal provided by the sensor 209c causes the paper pick-up assembly 208 to rotate the reel 208a an amount sufficient to unwind an amount of paper tape and contacts from the main reel assembly 206 to compensate for or overcome the tension in the contact strip at the roller 209b and, therefore, also downstream of that roller at the feed and shear assembly 202.

The feed and shear assembly 202 is mounted on the mounting plate 204 and includes a housing 210 at the downstream end of which there is provided a pick-up station 212 while at the upstream end of the housing there is provided a shear cylinder 214, to be more fully discussed. A shear arm 216 is pivotally mounted on the housing 210 by means of pivot pin 216'. The upstream end of the shear arm 216 is coupled to the piston or rod 214a of the shear cylinder (FIGS. 13, 20), while the downstream end of the shear arm 216 is coupled to a die block 202a, as to be described. A vacuum pick-up nozzle N is illustrated arranged at the pick-up station 212, which nozzle selectively descends down to the pick-up station 212 to pick up a contact or component and removed from the pick-up station to be mounted on a printed circuit board.

Suitable means are provided for attaching the feeder 200 to surface mount equipment, i.e. a pick-and-place machine. In FIG. 13, there is illustrated a locking arm 218 which is in the form of a lever which can be used to mount or release the feeder 200 from a pick-and-place machine. The specific means for locking or mounting the feeder on a pick-and-place machine is not critical for purposes of the present invention, it being understood that different locking means may be required for mounting the feeder 200 on different surface mounting machines. The locking or mounting assembly, which is illustrated and can be used at least in connection with some surface mounting machines, is a Sanyo mounting assembly. Regardless of which locking assembly is used, the pick-and-place machine may need to be modified to mate with the mounting assembly selected.

The main reel assembly 206 is rotatably mounted on the mounting plate 204 by means of a threaded pin or shaft 220a which is attached to the mounting plate and which defines the axis of rotation of the reel 206. A locking knob 220b can be used to secure the reel to the mounting plate during normal operation.

The reel 206 is initially wound with a rolled coil of a continuous strip of tab-connected surface mount contacts 222. Preferably, the coil is formed of a continuous strip forming a series of turns of tab-connected surface mount contacts 224, successive turns of the contacts preferably being separated by a paper tape 226, or the contacts nested within suitable undulations of a corrugated tape, as suggested in FIGS. 1–4 and in copending U.S. patent application Ser. No. 08/554,342, assigned to the assignee of the present invention. As indicated, as the product 222 is unwound the tape 226 is wound about the paper pick-up reel 208a, while the separated tab-connected strip of surface mount contacts 224 passes over the circumferential surface of the pin tensioning idler roller 209b. Advantageously, a suitable spring loaded retainer 209d maintains the strip 224 within the flanges of the idler roller 209b so as to remain within the roller irrespective of changes in tension in the strip of contacts 224.

In order to assure that the reel 206 does not become excessively unwound, and to prevent uncontrolled rotation of the reel, there is advantageously provided a reel securing assembly 227 which includes an engaging member 228, configurated to bridge the flanges of the reel 206 as well as being at least partially received between the flanges of the reel to engage the paper tape 206, thereby providing a measure of friction on the reel as well as the paper tape. The member 228 is urged against the reel by means of a leaf spring 230 fixedly mounted on a support block 232 secured to the mounting plate 204.

Referring to FIGS. 15–17, the details of the pick-up station are shown. In the feeder 200, as illustrated in FIGS. 13–20, the shear arm 216 and the shear cylinder 214 are arranged so that severance of a contact from the strip requires a downward stroke of the shear cylinder piston or rod 214a (FIGS. 13 and 20), so that the shear arm 216 rotates in a counterclockwise direction about pivot pin 216', as viewed in FIG. 13.

Provided in the die block 202a, at the pick-up station 212, is a vertical slot 202b and a shear punch 202c which is slidably movable along the direction of the slot 202b by means of a punch pin 202d fixed to the shear punch and received within the slot 202b. It is clear, therefore, that the limits of movements, upwardly and downwardly, of the shear punch 202c is determined by the length of the slot 202b.

Mounted on the die block 202a is a support block 202e which defines a cutting edge 202f. The cutting edge 202f is generally aligned along axis A (FIG. 15) of the vacuum pick-up nozzle N, and more specifically with the lumen L within such nozzle. A stop block 202g is positioned just downstream of the support block 202e and has a stop surface 202h essentially co-extensive with the downstream portion of the cutting edge 202f as shown.

Provided on the support block 202e, along the axis A, is an upper nozzle photo-sensor 202i, and a lower contact present photo-sensor 202j. The nozzle photo-sensor 202i is arranged to be covered by the nozzle N at the beginning of a pick-up stroke, while the contact present photo-sensor 202j is intended to provide a signal when a terminal or contact is situated at the pick-up station along the axis A and, therefore, ready for pick-up.

Refering to FIG. 17, the support block 202e is shown to be provided with alongitudinal groove or slot 202k for receiving a carrier strip CS (which connects the successive contacts to each other) and possibly connecting tabs CT (which connect the individual contacts to the carrier strip CS). Even a portion of the actual base B may be received within the slot 202k. Similarly, a slot 202n is provided for receiving the opposing side of the base B, such additional slot can be provided in any guide members, on the opposite side of the strip of contacts, positioned on the die block 202a. In the embodiment illustrated, the slot 202n is provided Within feed fingers 202m. it will be clear that with the arrangement illustrated in FIG. 17 the contacts, in this case pins P, are permitted to advance in a forward direction while being prevented from moving laterally to thereby assure that the pins are positioned precisely along the axis A once a contact has come into abutment against the stop surface 202h.

While the specific guides for properly positioning and guiding the tab-connected strips of surface mount contacts will differ for each contact type, the pins in the illustrated example each has a base B connected to the carrier strip CS by means of two spaced connecting tabs CT, best shown in FIG. 16. Once the downstream contact has come into abutment with the stop surface 202h, the shear punch 202c will have cutting edges which align with tab shearing lines CT' and carrier shearing line CS' as shown in FIG. 16. In FIG. 18 the punch pin 202d is shown in its upper position, indicating the position of the shear punch 202c at the upper end of its stroke, after having sheared the connecting strips CS (see stubs CT" in FIG. 18) and at the carrier shearing line CS'. In FIG. 18, furthermore, the nozzle N is shown to have partially received the pin P within the lumen L, the pin being raised by the vacuum suction in the nozzle N, after which the nozzle positions the pin at a suitable location on the printed circuit board for mounting thereon.

In FIG. 19, a feed cylinder 202p is illustrated mounted on the housing 210, and illustrating a feed cylinder sensor 202q for monitoring the position of the feed cylinder. The piston or rod 202r of the feed cylinder is coupled to one or more feed fingers (see, for example, feed finger 202m, 202m' in FIG. 21). A cylinder sensor 214b is illustrated in FIG. 20 which similarly monitors the condition of the shear cylinder 214.

Figure 21:
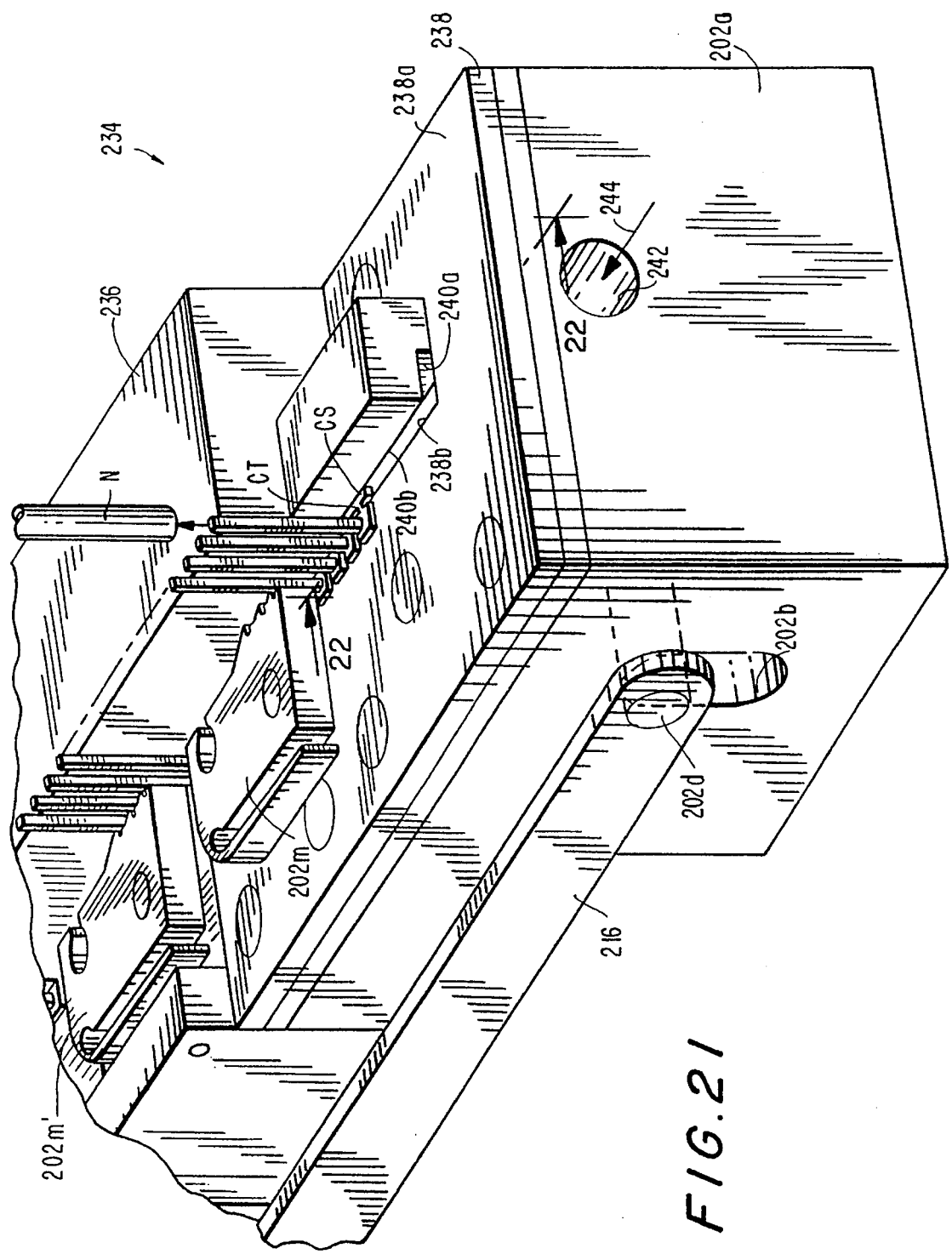
FIG. 21 is a perspective view of another embodiment of the feeder in accordance with the invention, shown during that portion of the cycle in which the shear punch holds or secures the strip of contact pins prior to severance of one of the pins and pick up by pick-up nozzle.

In FIGS. 21 and 22 and alternate embodiment 234 of the feeder is shown, in which the shear arm 216 must be rotated in a clockwise direction in order to shear a contact from the strip. Thus, in FIG. 21, the punch pin 202d is shown in its normal raised position within the slot 202b. In this embodiment a guide block 236 is provided which provides an elongated continuous groove or slot along the surface 238a of a top cutting die 238, similar to the slot 202k in FIG. 17. The slot in the guide block 236 continues as slot 240a within shear punch 240. The shear punch 240 is shown in its normal position with the punch pin at the upper end of the slot so that the connecting strip CT can be guided through the shear punch slot 240a as shown in FIG. 21. It will be clear that the guide block 236, together with the feed fingers 202m, 202m', will maintain the strip of contacts along their desired path to guide the contacts to the axis of the vacuum nozzle N. While not shown in FIG. 21, there is also advantageously provided a stop plate 241 (FIG. 22) which serves the same function as the stop block 202g in FIG. 15.

The shear arm 216 is preferably sufficiently biased in a clockwise direction, before the shear cylinder is actuated, to provide a sufficient force on the carrier strip CS to hold the contacts in place without actually shearing the connecting contact tabs CT. Thus, the guide block 236, the shear punch 240 and the feed fingers guide the contacts along the desired path toward the pick-up station for alignment with the vacuum pick-up nozzle N.

In FIG. 22, a vacuuming system is illustrated for removing cut off sections of the carrier strip CS. Thus, there is provided an air inlet channel 242 in the die block 202a which communicates with a slug cavity 248 formed in the shear punch into which the severed sections of the carrier strip CS are deposited when the shear punch 240 is moved downwardly by the shear arm 216. The slug cavity 248 communicates with a downstream passageway 250 within the housing which is attached to a source of vacuum and to a suitable receptacle (not shown) for receiving the sheared carrier strip sections. During operation, air is drawn into the unit through the air inlet 242 in the direction 244 as shown in FIG. 21. The air stream carries the cut off sections to the receptacle. This prevents accumulation of metal fragments at the pick-up station which might interfere with the advancement of the contact strip along the desired path.

The specific construction of the feed fingers 202m, 202m', etc. is not critical and these may have to be modified to engage different contacts. Thus, in FIG. 23, slightly modified feed fingers 202ma, 202s are illustrated for engaging and advancing a strip of series-connected surface mount tabs (quick disconnect contacts) T. Such tabs are more fully described in U.S. patent application Ser. No. 08/395,619, assigned to the assignee of the present invention. As will be noted, these tabs T are provided with a central pick-up post T' at the upper edge thereof which is centrally positioned for pick up by a standard size nozzle N. Still additional feed finger configurations are illustrated in FIG. 21 for engaging contact pins P and in FIG. 24, in which the fingers 202mb are designed to engage and advance series-connected surface mount clips C, such as might be used for fuse holders. Again, as in the previous embodiments, the guide blocks, shear punch, feed fingers, stop surfaces must all be modified to accommodate the specific configurations of the contacts being fed. The theory of operation for all of these is, however, essentially the same and it would be obvious to one skilled in the art to make the necessary modifications in order to use the principles of the present invention in feeding any desired series-connected surface mount contact.

Figure 25:
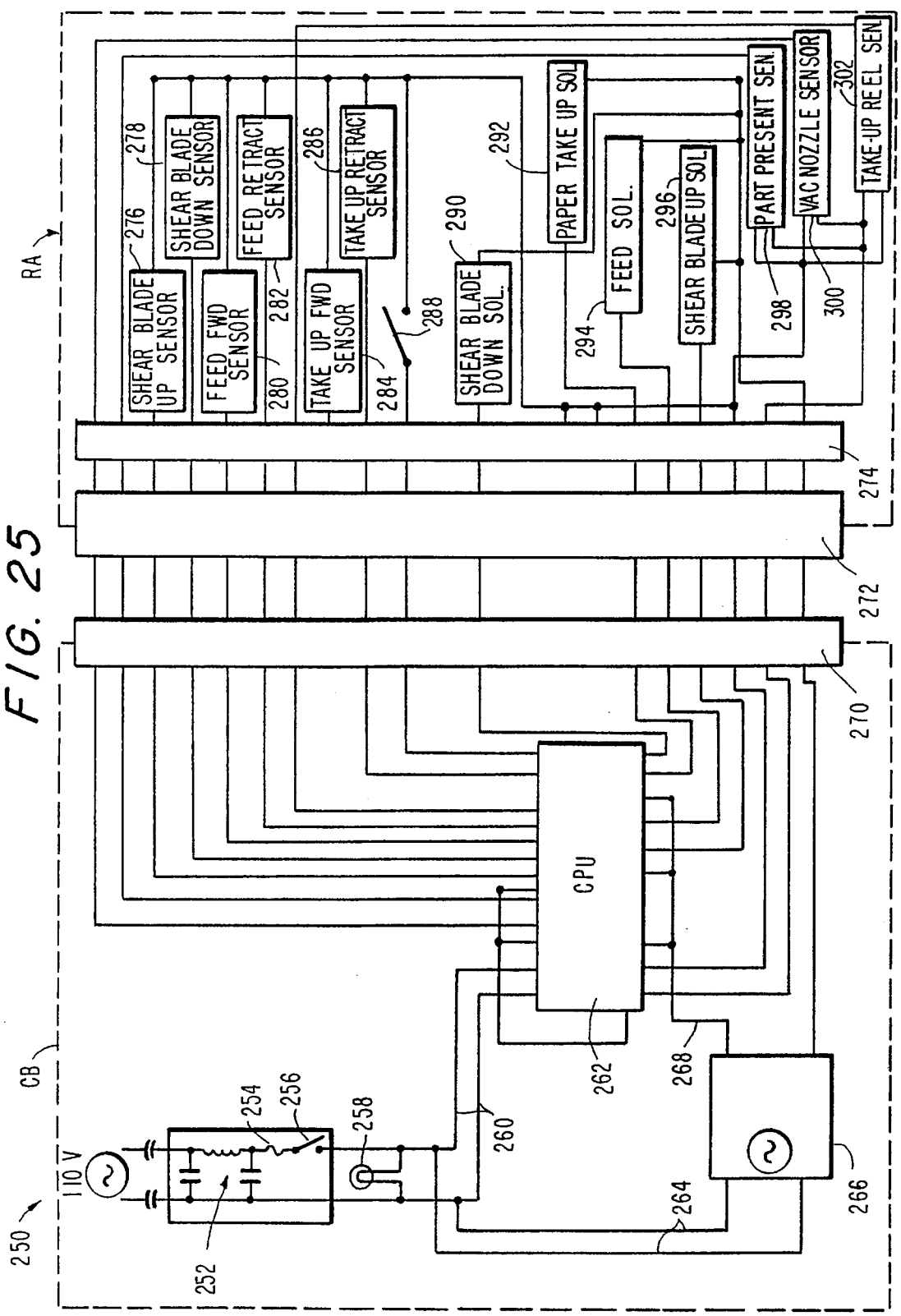
FIG. 25 is a schematic, partially in block form, forming part of a control circuit which includes a programmable logic comptroller for receiving inputs from sensors and for providing outputs for actuating operative components, such as solenoids, used in the feeder.

In FIG. 25, there is illustrated a schematic diagram, partially in block form, which illustrates the control system 250 for operating the feeders. A separate control box CB is illustrated which is in the nature of a programmable logic comptroller (PLC).

The control box CB is connected to a source of alternating voltage, as shown, by means of a conventional power line, which is advantageously fed to the control box by means of a filter 252 to eliminate high frequency spikes or transient voltages. The AC voltage is fed through a fuse 254 and a power switch 256 of the control box. A power on light 258 is shown across the source of voltage to indicate when the switch 256 is closed. The AC voltage is fed, by means of lines 260, to a CPU 262, the same voltage also being provided by means of lines 264 to a power supply 266 which converts the AC voltage to a DC voltage. The DC voltage is likewise applied to the CPU by means of line 268. The CPU 262 has a plurality of input and output terminals as shown. While the specific comptroller or micro processor is not critical, the processor illustrated is the Omron comptroller SP16-DT-A. The comptroller 262 is connected by means of interface connectors 270, 272 and 274 to a series of input and output devices within the reel assembly RA for signaling various conditions of components (e.g. sensors) of the feeder and for actuating other components (e.g. solenoids) to provide the proper sequencing and operation of the feeder. Thus, the reel assembly RA includes a "shear blade up" sensor 276, a "shear blade down" sensor 278, a "feed forward" sensor 280, a "feed retract" sensor 282, a "take-up forward" sensor 284, a "take-up retract" sensor 286, a reset switch 288, a "shear blade down" solenoid 290, a paper "take-up" solenoid 292, a "feed" solenoid 294, a "shear blade up" solenoid 296, a "part present" sensor 298, a "vacuum nozzle" sensor 300, and a "take-up reel" sensor 302. Some of these components have already been discussed to possibly under reference numerals. Thus, the "vacuum nozzle" sensor 300 corresponds to the sensor 202i in FIGS. 15 and 18, the "part present" sensor 298 corresponds to the sensor 202j in those figures and the "feed forward" sensor 280 corresponds to the tension sensor 209c in FIG. 14.

Figure 23:
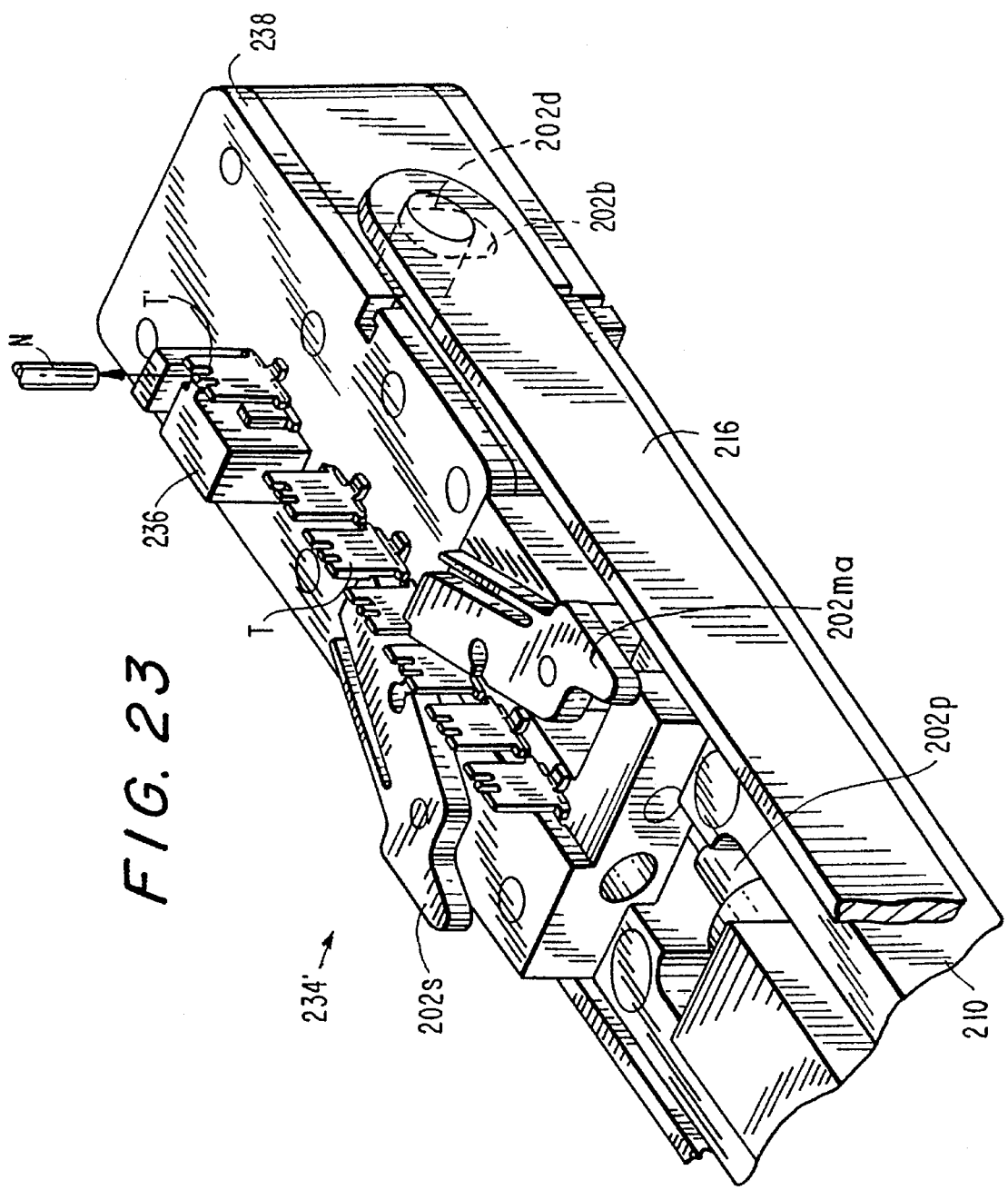
FIG. 23 is a perspective view of another embodiment in accordance with the invention, similar the embodiment shown in FIG. 21, but modified to accommodate a continuous strip of tab (quick disconnect) contacts.
Figure 24:
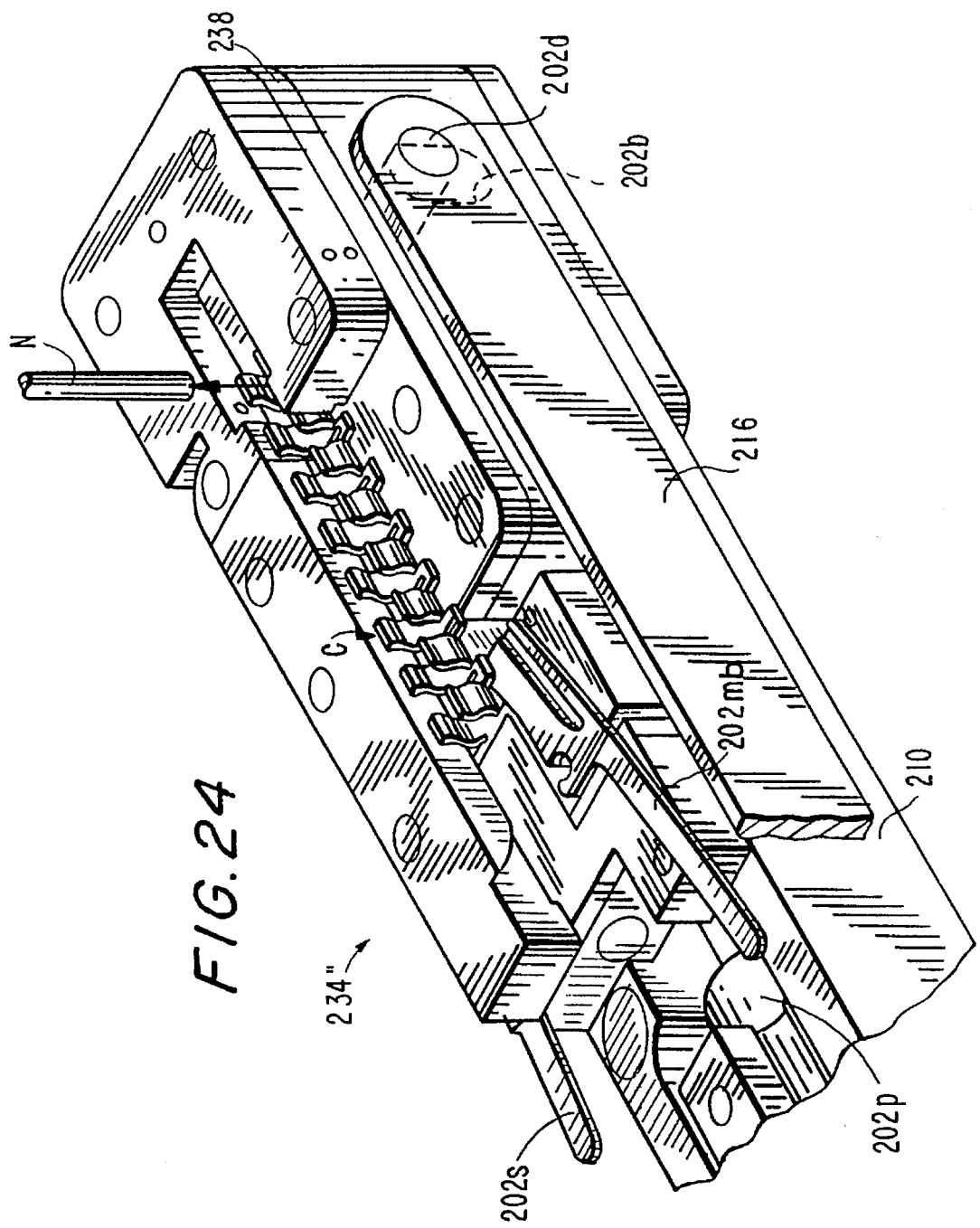
FIG. 24 is similar to FIG. 23, but modified to accommodate a continuous strip of tab connected clip contacts.

The operation of the feeder 234 (FIG. 21), and corresponding feeders 234' in FIG. 23 and 234" in FIG. 24, will now be described. As the vacuum pick-up nozzle N descends towards the contact to be picked up, the nozzle photo-sensor 300 (FIG. 25) is blocked, initiating the cycle. A signal is sent to the comptroller 262 which activates the shear cylinder 214 "shear blade down" solenoid 290. The shear punch 240 descends, as a result of the downward movement of the shear arm 216 (FIG. 21), separating a pin P from its carrier strip CS by severing the connecting tabs CT. The vacuum nozzle N draws the loose pin from the pick-up station 212 until the pin base B comes into contact with the nozzle tip. After the nozzle picks up the part that moves away, the "part present" sensor 298 and the "vacuum nozzle" sensor 300 detect the absence of the pin and nozzle, respectively, and return the shear punch 240 to its up position. When the "shear cylinder up" sensor 276 is activated, the feed cylinder 202p retracts and then indexes forward to feed the next pin to the pick-up station. The "part present" photo-sensor 298 sends an input signal to the comptroller 262 indicating that the pin is at a shear area aligned with the axis A of the vacuum nozzle N. The shear cylinder 214 is actuated, causing the spring loaded shear punch 240 to clamp the carrier strip CS, but without sufficient force to shear the connecting tabs CT. The cycle is now complete. The next cycle begins with the descent of the pick-up nozzle N, as sensed by the vacuum nozzle sensor 300.

From the foregoing detailed description it will be evident that there are a number of changes, adaptations and modifications of the present invention which come within the province of those persons having ordinary skill in the art to which the aforementioned invention pertains. However, it is intended that all such variations not departing from the spirit of the invention be considered as within the scope thereof as limited solely by the appended claims.

I claim:

1. Feeder for individually dispensing surface-mount contacts from a strip of tab-connected contacts on a pick-and-place machine having a pick-up member at a pick-up station and an actuator for actuating the feeder when the pick-and-place machine is ready to pick up a surface-mount contact oriented along a predetermined direction at the pick-up station, the feeder comprising receiving means for receiving a leading end of the tab-connected strip of surface-mounted contacts; transporting means for transporting at least the leading surface-mount contact with an orientation along said predetermined direction to said pick-up station; advancing means responsive to the actuator for advancing the strip of contacts one contact at a time along said transporting means; cutting means responsive to the actuator for severing a connecting tab between the leading surface-mount contact and the next following surface mount contact of the strip to thereby free said leading surface-mount contact, said cutting means temporarily holding said leading surface-mount contact to maintain said predetermined direction and position of the severed surface-mount contact between the time that said leading surface-mount contacts is severed from the strip and the time that the pick-up member of the pick-and-place machine has engaged the contact sufficiently to enable it to pick up the contact and remove it from said pick-up station.

2. Feeder as defined in claim 1, wherein the strip is in the form of a coiled roll, and further comprising a reel for rotatably supporting the coiled roll of surface-mount contacts and for dispensing the strip of surface-mount contacts to said receiving means by unwinding the coiled roll.

3. Feeder as defined in claim 2, wherein the surface-mount contacts are arranged in the coiled roll with orientations offset from said predetermined direction, and said transporting means includes re-orienting means for re-orienting the surface-mount contacts from the orientations within the coiled roll to orientations corresponding to said predetermined direction.

4. Feeder as defined in claim 3, wherein the surface-mount contacts are surface-mounted posts each having a base and an elongate pin normal to the base, the pins being arranged within the coiled roll to substantially dispose the bases of the posts in a common plane and the pins arranged along directions substantially parallel to the rotating axis, said re-orienting means rotating the pins 90° from horizontal orientations of the pins when first entering said transporting means to vertical orientations when departing said transporting means and entering said pick-up station.

5. Feeder as defined in claim 1, wherein the surface-mount contacts are nested within a protective carrier strip, and further comprising separating means for separating the surface-mount contacts from the protective carrier strip prior to said pick-up station.

6. Feeder as defined in claim 1, wherein the pick-and-place machine includes a mechanical actuator mounted for movement between retracted and extended positions in synchronism with the movements of the pick-up member, wherein said advancing means advances the strip a distance equivalent to the dimension of a contact along the direction of the strip in response to movement of the mechanical actuator into engagement with a portion of said advancing means in the extended position of the actuator, said cutting means including an element engeagable with said mechanical actuator when said mechanical actuator approaches said extended position to activate said cutting means.

7. Feeder as defined in claim 6, wherein said advancing means includes a movable block reciprocally movable along the transporting direction of the strip in response to reciprocal movements of the mechanical actuator; a spring-loaded advancing finger mounted on said movable block arranged to positively engage a contact when said movable block advances towards said pick-up station to advance the strip; and a spring-loaded blocking finger to positively engage a contact when the strip has a tendency to reverse its direction of movement away from said pick-up station.

8. Feeder for individually dispensing surface-mount contacts from a strip of tab-connected contacts on a pick-and-place machine having a pick-up member at a pick-up station and an actuator for actuating the feeder when the pick-and-place machine is ready to pick up a surface-mount contact oriented along a predetermined direction at the pick-up station, the feeder comprising receiving means for receiving a leading end of the tab-connected strip of surface-mounted contacts; transporting means for transporting at least the leading surface-mount contact with an orientation along said predetermined direction to said pick-up station; advancing means responsive to the actuator for advancing the strip of contacts one contact at a time along said transporting means; cutting means responsive to the actuator for severing a connecting tab between the leading surface-mount contact and the next following surface mount contact of the strip to thereby free said leading surface-mount contact; sensing means for at least sensing the presence of the pick-up member at said pick-up station just prior to pick-up of the leading surface mount contact; and control means for initiating the operation cycle of the feeder in response to sensing of the pick-up member by said sensing means resulting in the severing of the leading surface mount contact from the strip of contacts and pick-up thereof by the pick-up member.

9. Feeder for individually dispensing surface-mount contacts from a source of strip of tab-connected contacts on a pick-and-place machine having a pick-up member at a pick-up station and an actuator for actuating the feeder when the pick-and-place machine is ready to pick up a surface-mount contact oriented along a predetermined direction at the pick-up station, the feeder comprising receiving means for receiving a leading end of the tab-connected strip of surface-mounted contacts; transporting means for transporting at least the leading surface-mount contact with an orientation along said predetermined direction to said pick-up station; advancing means responsive to the actuator for advancing the strip of contacts one contact at a time along said transporting means; cutting means responsive to the actuator for severing a connecting tab between the leading surface-mount contact and the next following surface mount contact of the strip to thereby free said leading surface-mount contact; and tension adjusting means for adjusting the tension of the strip of surface-mounted contacts to be substantially uniform at said receiving means substantially independently of the tension on the strip at the source thereof.

10. Feeder for individually dispensing surface-mount contacts from a strip of tab-connected contacts on a pick-and-place machine having a pick-up member at a pick-up station and an actuator for actuating the feeder when the pick-and-place machine is ready to pick up a surface-mount contact oriented along a predetermined direction at the pick-up station, the feeder comprising receiving means for receiving a leading end of the tab-connected strip of surface-mounted contacts; transporting means for transporting at least the leading surface-mount contact with an orientation along said predetermined direction to said pick-up station; advancing means responsive to the actuator for advancing the strip of contacts one contact at a time along said transporting means; cutting means responsive to the actuator for severing a connecting tab between the leading surface-mount contact and the next following surface mount contact of the strip to thereby free said leading surface-mount contact; and disposing means for removing the severed connecting tabs from said pick-up station to avoid intereference with the continued advancement of the strip of contacts and operation of the feeder.

* * * * *